United States Patent
Lee et al.

(10) Patent No.: US 6,297,080 B1
(45) Date of Patent: Oct. 2, 2001

(54) METHOD OF CRYSTALLIZING A SILICON FILM AND A METHOD OF MANUFACTURING A LIQUID CRYSTAL DISPLAY APPARATUS

(75) Inventors: Kyung-Eon Lee; Jae-Beom Choi, both of Kyongki-do (KR)

(73) Assignee: LG. Philips LCD Co. Ltd., Seoul (KR)

( * ) Notice: Subject to any disclaimer, the term of this patent is extended or adjusted under 35 U.S.C. 154(b) by 0 days.

(21) Appl. No.: 09/435,986

(22) Filed: Nov. 8, 1999

(30) Foreign Application Priority Data

Nov. 9, 1998 (KR) .................................. 98-47861
Dec. 21, 1998 (KR) .................................. 98-56782

(51) Int. Cl.$^7$ .................................................. H01L 21/00
(52) U.S. Cl. .................... 438/151; 438/156; 438/160; 438/162; 257/55
(58) Field of Search .................... 257/66, 57, 59, 257/347, 72, 55, 63–6, 69–70; 438/166, 789, 151, 156, 160, 662, 795, 770, 775, 669, 149

(56) References Cited

U.S. PATENT DOCUMENTS

| | | | |
|---|---|---|---|
| 4,997,779 | * | 3/1991 | Kohno ..................................... 437/41 |
| 5,403,772 | * | 4/1995 | Zhang et al. ........................... 437/101 |
| 5,501,989 | * | 3/1996 | Takayama et al. ...................... 437/21 |
| 5,595,944 | * | 1/1997 | Zhang et al. ............................ 437/41 |
| 5,643,801 | * | 7/1997 | Ishihara et al. ........................... 437/7 |
| 5,712,191 | * | 1/1998 | Nakajima et al. ..................... 437/174 |
| 5,756,364 | * | 5/1998 | Tanaka et al. .......................... 437/21 |
| 5,773,846 | * | 6/1998 | Zhang et al. ............................ 257/66 |
| 6,060,725 | * | 5/2000 | Zhang et al. ............................ 257/66 |
| 6,097,037 | * | 8/2000 | Joo et al. ................................ 257/55 |
| 6,197,623 | * | 3/2001 | Joo et al. .............................. 438/151 |

FOREIGN PATENT DOCUMENTS

| | | | | |
|---|---|---|---|---|
| 54-111291 | * | 8/1979 | (JP) .......................................... 27/10 |
| 359035474 | * | 2/1984 | (JP) .......................................... 29/78 |
| 363009960 | * | 2/1984 | (JP) ........................................... 27/6 |
| 02006138 | * | 1/1990 | (JP) ........................................... 27/4 |
| 4280623 | | 10/1992 | (JP) . | |
| 11214536 | * | 8/1999 | (JP) .......................................... 27/92 |

* cited by examiner

Primary Examiner—Charles Bowers
Assistant Examiner—Laura M Schillinger

(57) ABSTRACT

A method of crystallizing a silicon film and a method of manufacturing a liquid crystal display apparatus which uses the Joule heat of a heat generating conductive layer to increase the temperature of a silicon film for expediting silicon crystallization includes forming an amorphous silicon film on an insulating substrate, forming a heat generating conductive layer over the amorphous silicon film, and applying a voltage to the heat generating conductive layer wherein electric current flows through the heat generating conductive layer.

23 Claims, 25 Drawing Sheets

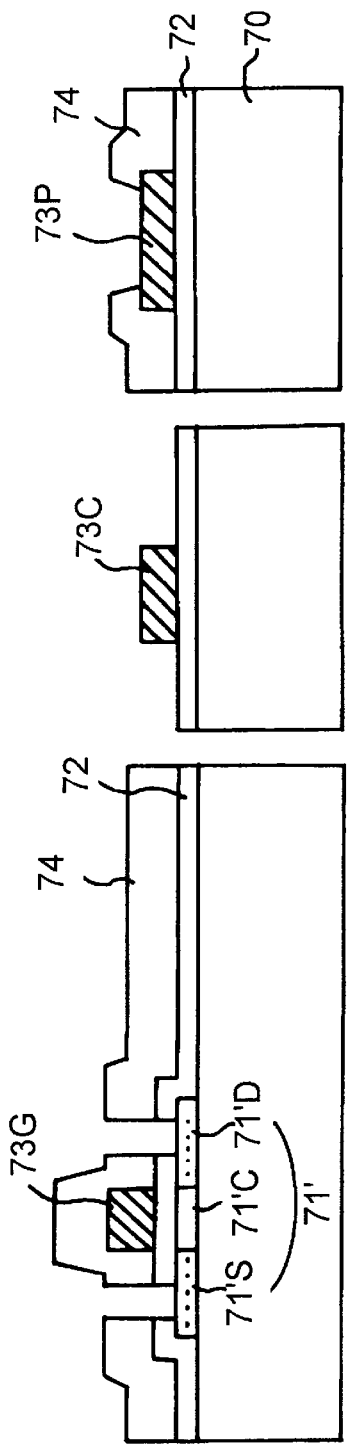
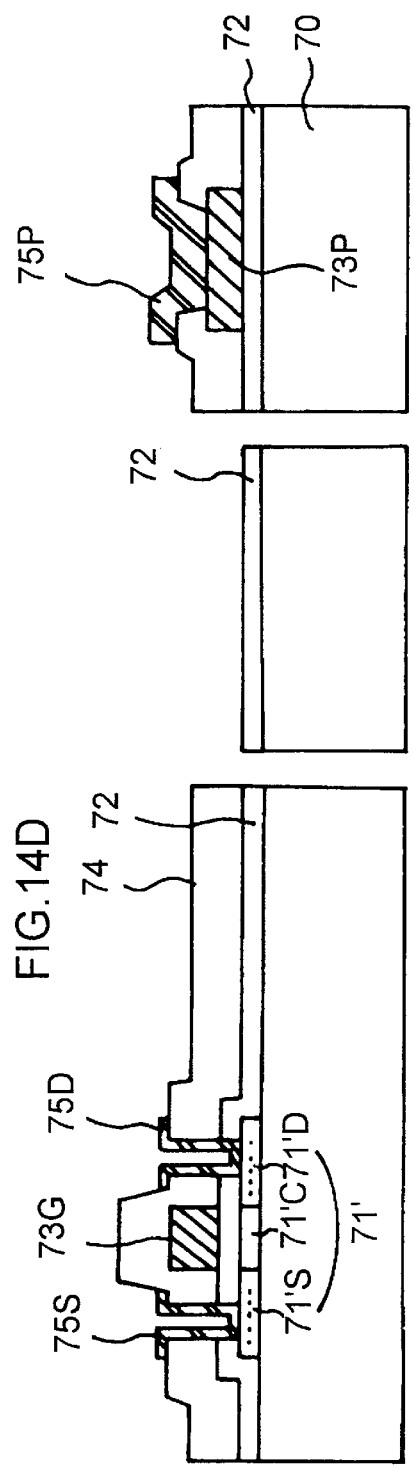

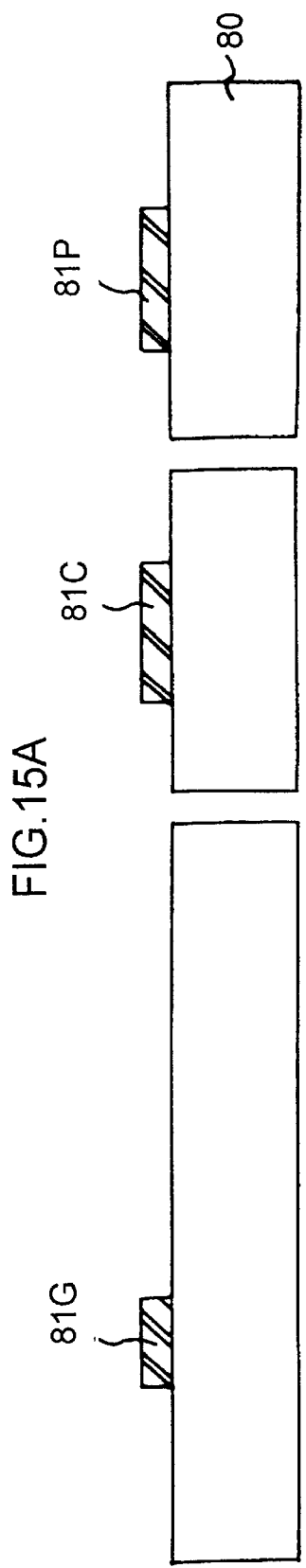
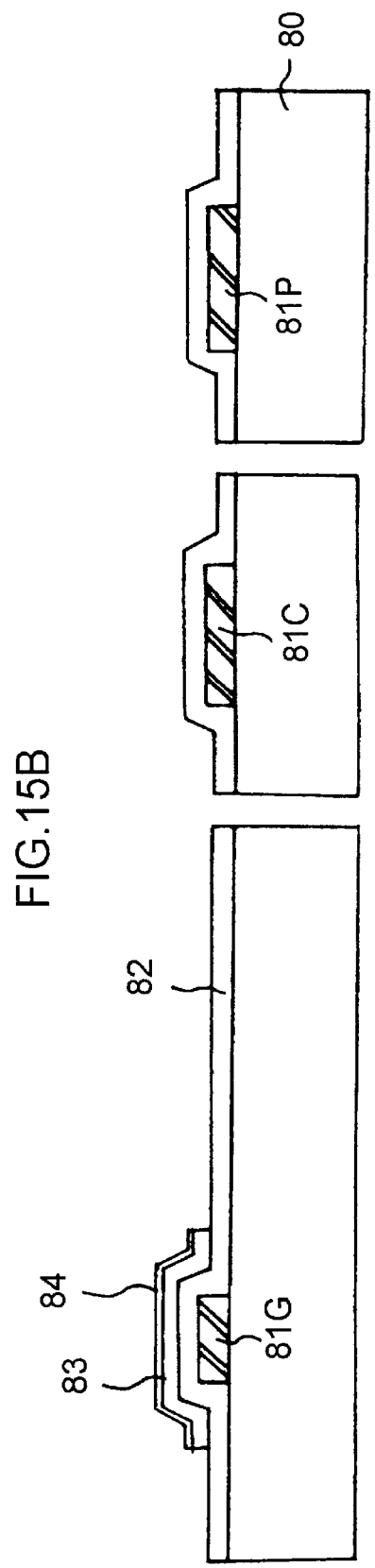

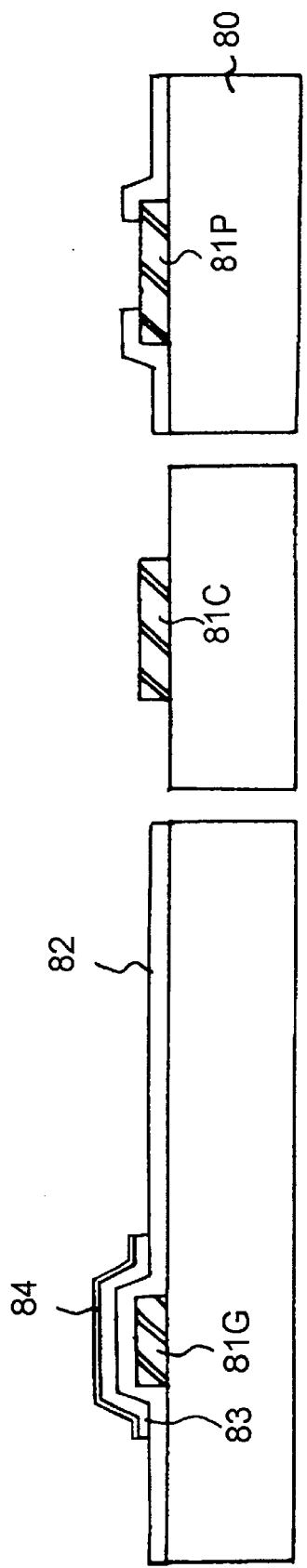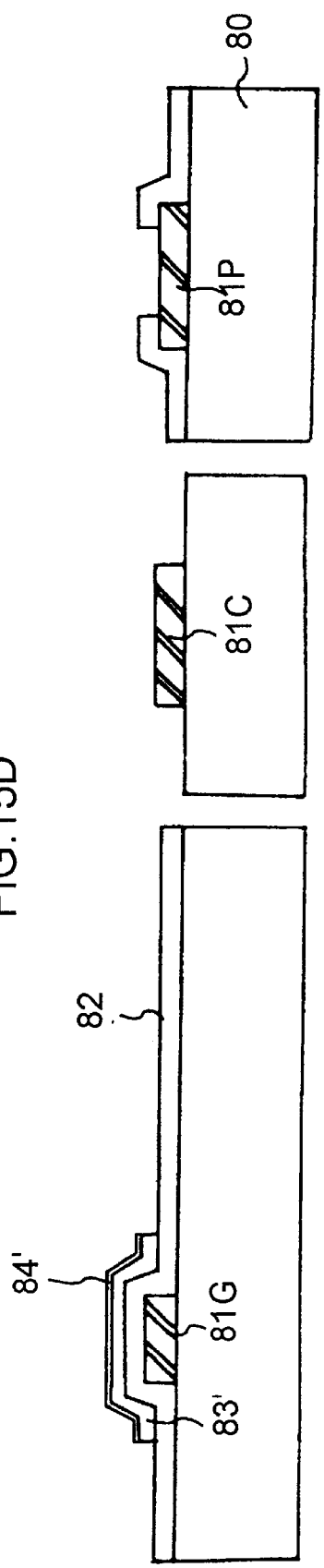

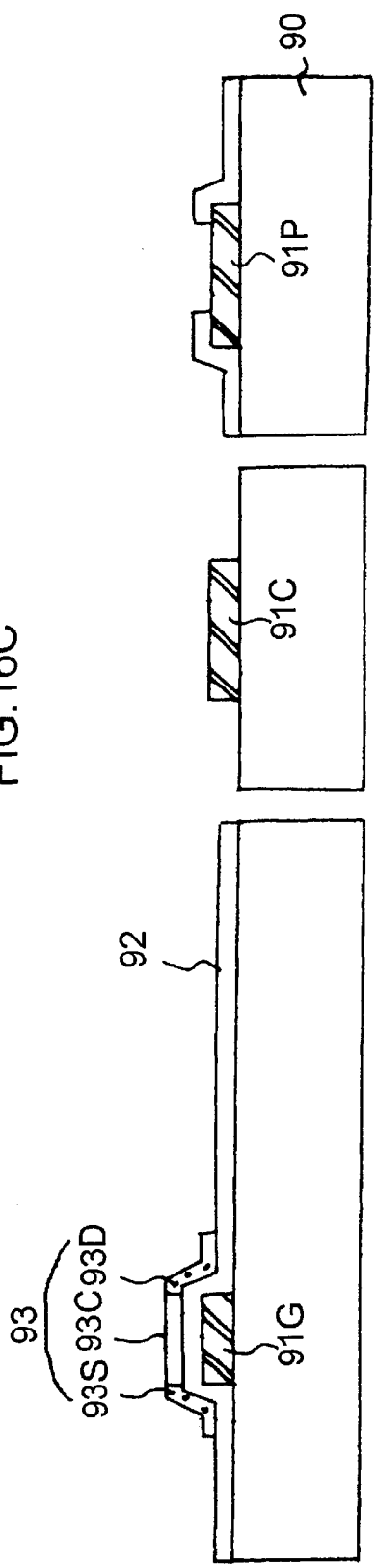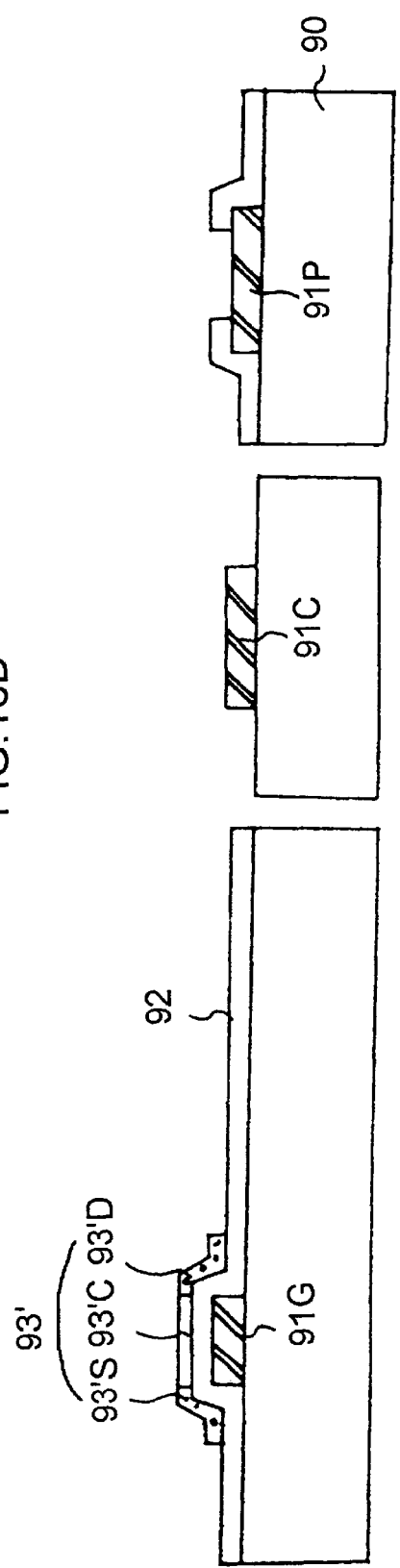

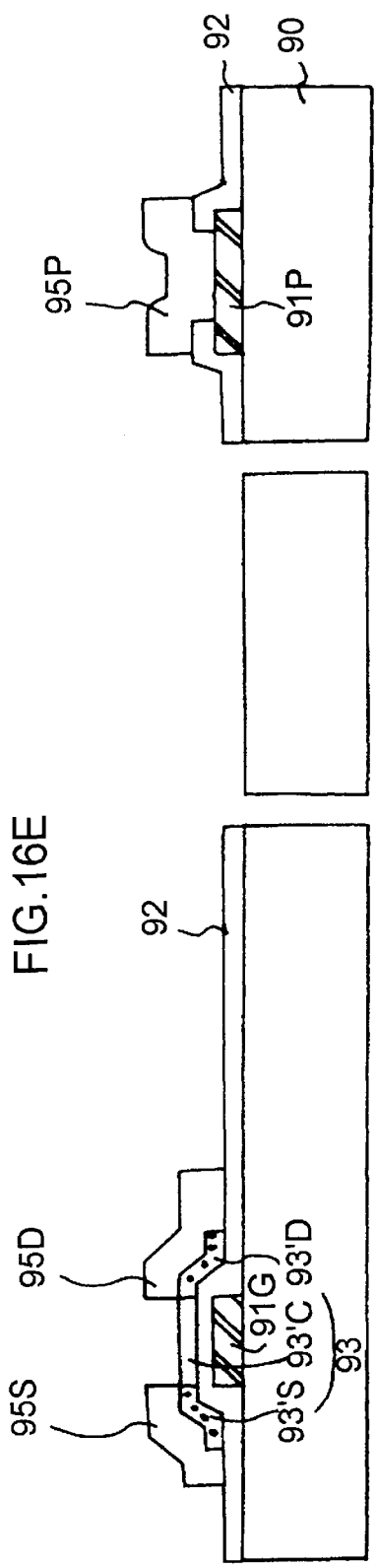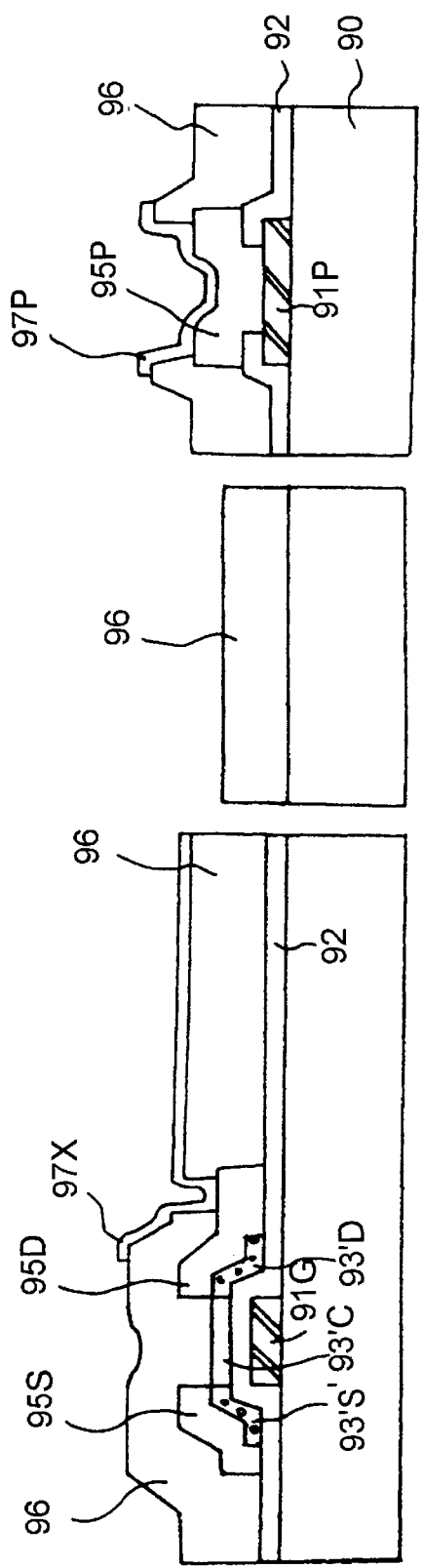

METHOD OF CRYSTALLIZING A SILICON FILM AND A METHOD OF MANUFACTURING A LIQUID CRYSTAL DISPLAY APPARATUS

BACKGROUND OF THE INVENTION

I. Field of Invention

The present invention relates to a method of crystallizing a silicon film and a method of manufacturing a liquid crystal display apparatus which uses the Joule heat of a heat generating conductive layer to increase the temperature of a silicon film for expediting silicon crystallization.

II. Discussion of Related Art

An active layer of a thin film transistor (hereinafter abbreviated TFT) in a liquid crystal display (hereinafter abbreviated LCD) is made of a silicon film which is in a polycrystalline state because the mobility of electric charges of polycrystalline silicon is higher than that of amorphous silicon. Polycrystalline silicon has usually been formed at a high temperature. A new technique of manufacturing a TFT of polycrystalline silicon at low temperature is currently being used.

Low temperature polycrystalline silicon has various advantages such as the low process temperature, the capability of forming a large LCD area and the comparability of performance equal to the high temperature polycrystalline silicon process. There are several methods of forming low temperature polycrystalline silicon such as Solid Phase Crystallization (hereinafter abbreviated SPC), Laser Crystallization and other methods.

Laser crystallization crystallizes amorphous silicon into polycrystalline silicon by applying a laser to an amorphous silicon layer under 400 degrees Celsius and provides excellent performance. Unfortunately, the crystallization fails to provide uniformity. The method is not suitable for manufacturing polycrystalline silicon for a large scale LCD due to the high cost of equipment and low productivity.

SPC crystallizes amorphous silicon into the polycrystalline silicon (polysilicon) by carrying out heat treatment at 550 to 700 degrees Celsius for about 24 hours and provides uniform polycrystals using equipment that is not so expensive. Unfortunately, the temperature and time required for crystallization are high and long so that a glass substrate cannot be used. Also, productivity using this method is low.

Another technique for the crystallization of amorphous silicon is Metal Induced Crystallization (hereinafter abbreviated MIC) which is illustrated in FIG. 1A and FIG. 1B. MIC achieves crystallization by contacting amorphous silicon with a metal catalyst which accelerates the silicon crystallization at about 500 degrees Celsius.

Referring to FIG. 1A, after a buffer layer 10 of silicon oxide has been formed on an insulated substrate 100, an amorphous silicon layer 11 is deposited on the buffer layer 10. Then, a metal film 13 such as a Ni film working as a catalyst layer for crystallization is formed on the amorphous silicon layer 11. In this case, the metal film 13 of Ni is deposited on the amorphous silicon layer 11 by sputtering which is a conventional method of depositing metal.

Referring to FIG. 1B, the amorphous silicon layer 11 undergoes heat treatment on the above substrate for crystallization.

As a result of the heat treatment, silicide (not shown) is formed by diffusion of the Ni layer toward a silicon layer so as to form a silicide region at the boundary of the silicon layer and Ni layer. The silicide accelerates the crystallization of the silicon film to crystallize the amorphous silicon layer into a polycrystalline film 19 at a low crystallization temperature.

In MIC as a related art, silicon crystallization occurs by forming a Ni film having a predetermined thickness. Thus, excessive Ni in an amount equal to the thickness of the metal layer remains in the crystallized silicon film. Therefore, a TFT of polycrystalline silicon contaminated with the excessive Ni is unable to be used as a switching device due to degraded device characteristics.

Moreover, it takes more than 10 hours to crystallize silicon and the crystallization temperature is not that low. Thus, the time and temperature required for this process are unacceptable.

Metal induced lateral crystallization [hereinafter abbreviated MILC, S. W. Lee & S. K. Joo, IEEE Electron Device Lett., 17(4), P.160, (1996)] as an alternative method has been proposed lately.

MILC as shown in FIG. 2 is performed such that silicon crystallization is induced laterally in a predetermined region which has been crystallized by MIC. In MILC, a portion of amorphous silicon 22-1 contacted with a specific metal 23 is crystallized by MIC, and a boundary of the crystallized silicon region 22-1 becomes a seed for crystallizing laterally the adjacent portion of the amorphous silicon 22-2 which is not directly contacted with the metal. Unfortunately, the crystallization speed of MILC is slow.

SUMMARY OF THE INVENTION

To overcome the problems described above, preferred embodiments of the present invention provide a method of crystallizing a silicon film and a method of manufacturing a liquid crystal display apparatus which achieve a silicon crystallization at a low temperature or a room temperature by increasing a temperature of an amorphous silicon film to be crystallized, by generating heat by applying voltage to a heat generating conductive layer.

In addition, preferred embodiments of the present invention provide a method of crystallizing a silicon film which greatly decreases the silicon crystallization time and power consumption by concentrating the Joule heat from the heat generating layer onto the amorphous silicon which is to be crystallized to define an active layer.

Additional features and advantages of the present invention will be set forth in the detailed description which follows and in part will be apparent from the detailed description, or may be learned by practice of the invention. The advantages, improvements, benefits and other aspects of the present invention are achieved by the various preferred embodiments particularly explained in the detailed description and claims hereof as well as the appended drawings.

To achieve these and other advantages and in accordance with the purposes of the present invention, as embodied and broadly described, a method according to a preferred embodiment of the present invention includes the steps of forming an amorphous silicon film on an insulating substrate, forming a heat generating conductive layer over the amorphous silicon film, and applying a predetermined voltage to the heat generating conductive layer wherein electric current flows through the heat generating conductive layer to the amorphous silicon film so as to maximize crystallization of the amorphous silicon layer.

Another preferred embodiment of the present invention includes the steps of forming an amorphous silicon film and a heat generating conductive layer on a substrate in the same plane, and increasing a temperature of the amorphous silicon film by applying a predetermined voltage to the heat generating conductive layer wherein heat is generated from the heat generating conductive layer.

In another preferred embodiment of the present invention, a method includes the steps of forming a heat generating conductive layer on an insulating substrate, forming an insulating layer on the heat generating conductive layer, forming an amorphous silicon film on the insulating layer, and applying a predetermined voltage to the heat generating conductive layer wherein electric current is transmitted through the heat generating conductive layer to the amorphous silicon film.

In another preferred embodiment of the present invention, a method includes the steps of forming an active layer of amorphous silicon on a substrate, forming a first insulating layer on the substrate including the active layer, forming a gate pattern on the first insulating layer wherein the gate pattern includes a gate line having a gate electrode, a connecting bar connecting the gate line to other gate lines, a connecting bar pad, a test electrode, and a test electrode pad, doping the active layer with impurities while using the gate electrode as a mask, forming a second insulating layer over the substrate, exposing portions of the active layer doped with the impurities, the connecting bar pad, the connecting bar, and the test electrode pad by etching the second insulating layer by photolithography, crystallizing the amorphous silicon constituting the active layer by heating the active layer via predetermined voltage is applied between the connecting bar pad and the test electrode pad, forming a conductive layer covering a top surface of the substrate, forming a photoresist pattern covering portions of the conductive layer over the source, the drain, and the test electrode pad on the conductive layer, forming source and drain electrodes and a first test cover layer by etching the conductive layer while using the photoresist pattern as a mask, and removing the connecting bar.

In another preferred embodiment of the present invention, a method includes the steps of forming a plurality of gate lines, a connecting bar connecting first ends of the gate lines to one another in common, and a test electrode bar connecting the other ends of the gate lines to one another in common on an insulating substrate, forming a first insulating layer covering the gate lines, the connecting bar, and the test electrode bar, depositing an amorphous silicon film and a doped amorphous silicon film successively on the first insulating layer, forming an ohmic contact layer by etching the doped amorphous silicon film, forming an active layer by etching the amorphous silicon film, exposing the connecting bar and the test electrode pad by etching the first insulating layer, crystallizing the amorphous silicon constituting the active layer and the ohmic contact layer by increasing a temperature of the active and ohmic contact layers by applying a predetermined voltage between the connecting bar and the test electrode wherein electric current is transmitted through the gate lines, depositing a conductive layer over the substrate, forming a photoresist pattern covering the conductive layer over the source and drain and the test electrode pad, forming source and drain electrodes and a first test cover layer by etching the conductive layer while using the photoresist pattern as a mask, etching the ohmic contact layer while using the source and drain electrodes as a mask, and removing the connecting bar.

In a further preferred embodiment of the present invention, a method includes the steps of forming a plurality of gate lines, a connecting bar connecting first ends of the gate lines to one another in common, and a test electrode bar connecting the other ends of the gate lines to one another in common on an insulating substrate, forming a first insulating layer covering the gate lines, the connecting bar, and the test electrode bar, depositing an amorphous silicon film on the first insulating layer, forming an active layer by etching the amorphous silicon film, forming a source region and a drain region by doping the active layer with impurities selectively, exposing the connecting bar and the test electrode pad by etching the first insulating layer, crystallizing the amorphous silicon constituting the active layer by increasing a temperature of the active layer by applying a voltage between the connecting bar and the test electrode wherein electric current is transmitted through the gate lines, depositing a conductive layer over the substrate, forming a photoresist pattern covering the conductive layer over the source and drain and the test electrode pad, forming source and drain electrodes and a first test cover layer by etching the conductive layer while using the photoresist pattern as a mask, and removing the connecting bar.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate preferred embodiments of the invention and together with the description serve to explain the principles of the present invention.

FIG. 14A to FIG. 14E show cross-sectional views of a method of manufacturing an LCD according to a ninth preferred embodiment of the present invention;

FIG. 15A to FIG. 15F show cross-sectional views of a method of manufacturing an LCD according to a tenth preferred embodiment of the present invention;

FIG. 16A to FIG. 16F show cross-sectional views of a method of manufacturing an LCD according to an eleventh preferred embodiment of the present invention;

Figure 17:
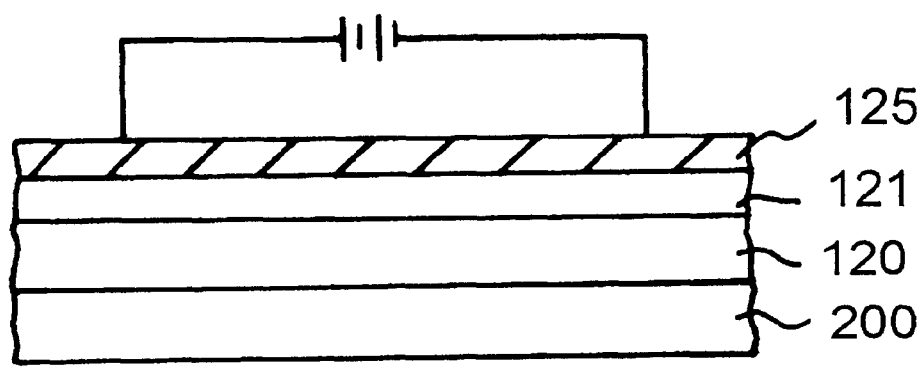
Figure 18:
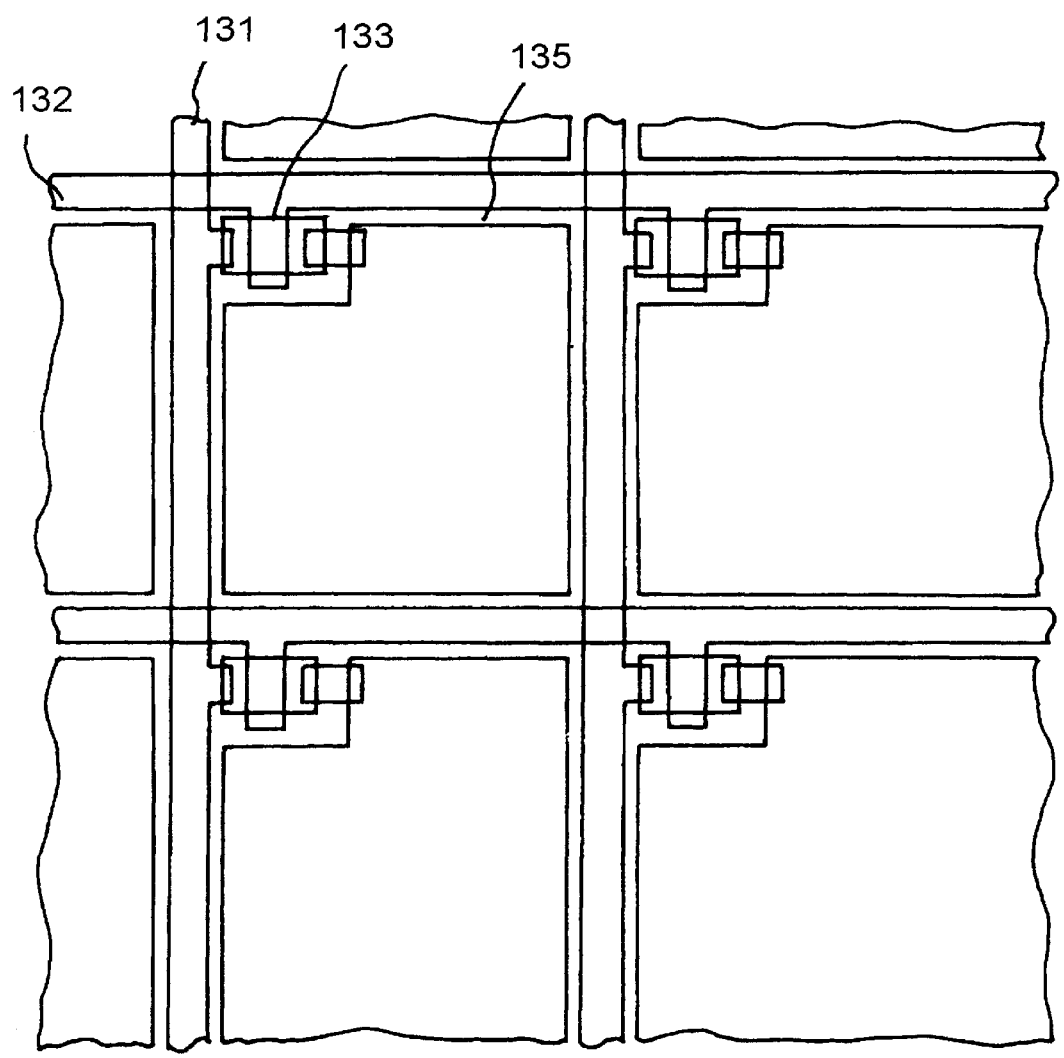
Figure 19:
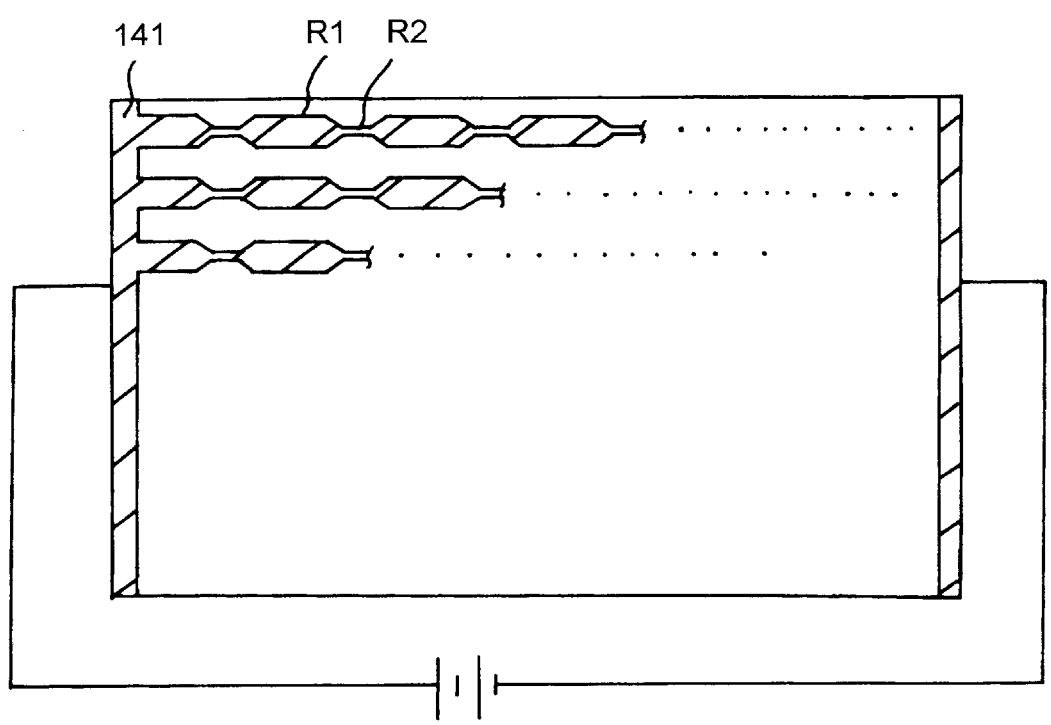
Figure 20:
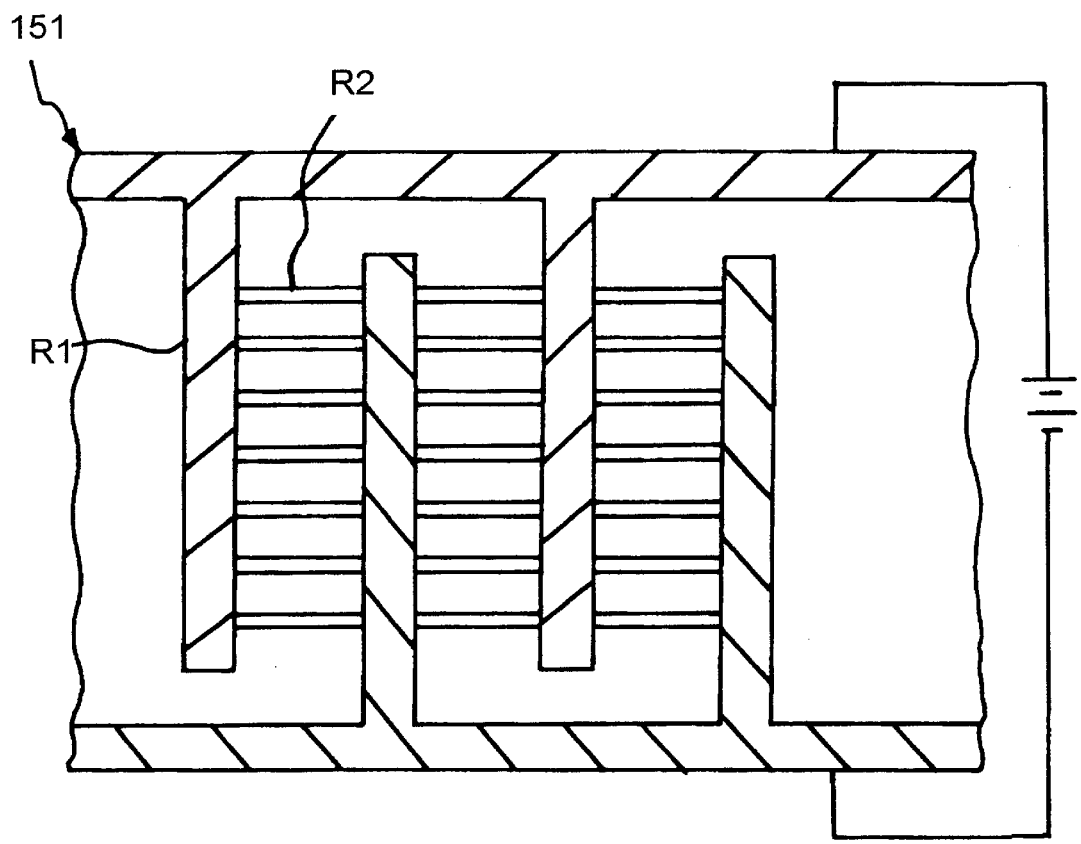
Figure 21:
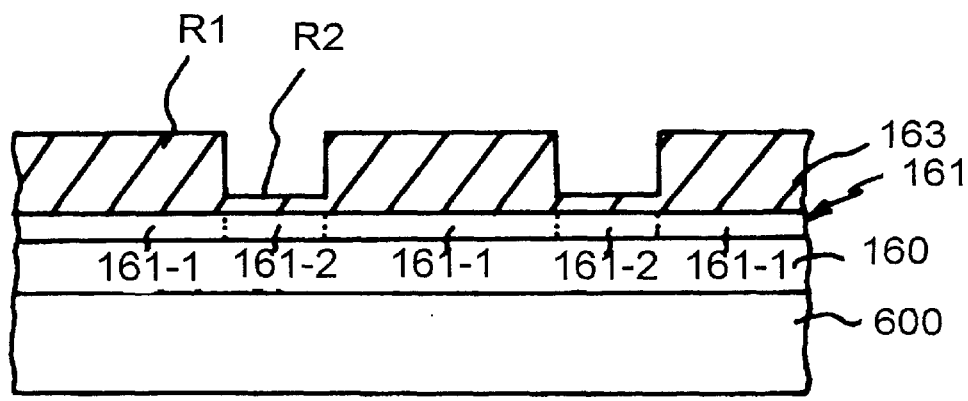
Figure 22:
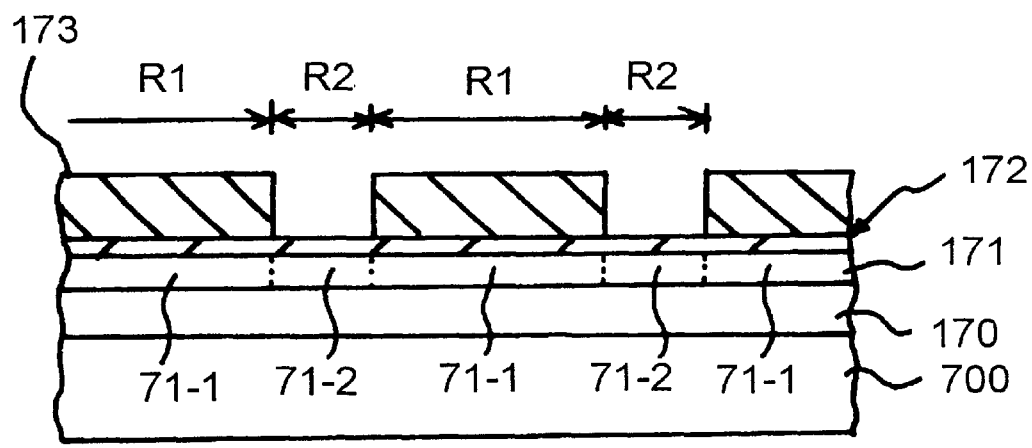

FIG. 17 explains the silicon crystallization using the Joule heat of a heat generating conductive layer according to a twelfth preferred embodiment of the present invention;

FIG. 18 shows a schematic layout of a liquid crystal display according to a thirteenth preferred embodiment of the present invention;

FIG. 19 shows a layout explaining silicon crystallization according to a fourteenth preferred embodiment of the present invention;

FIG. 20 shows a layout explaining silicon crystallization according to a fifteenth preferred embodiment of the present invention;

FIG. 21 shows a cross-sectional view explaining silicon crystallization according to a sixteenth preferred embodiment of the present invention; and FIG. 22 shows a cross-sectional view explaining silicon crystallization according to a seventeenth preferred embodiment of the present invention.

DETAILED DESCRIPTION OF PREFERRED EMBODIMENTS

Reference will now be made in detail to preferred embodiments of the present invention, examples of which are illustrated in the accompanying drawings.

Figure 1A:
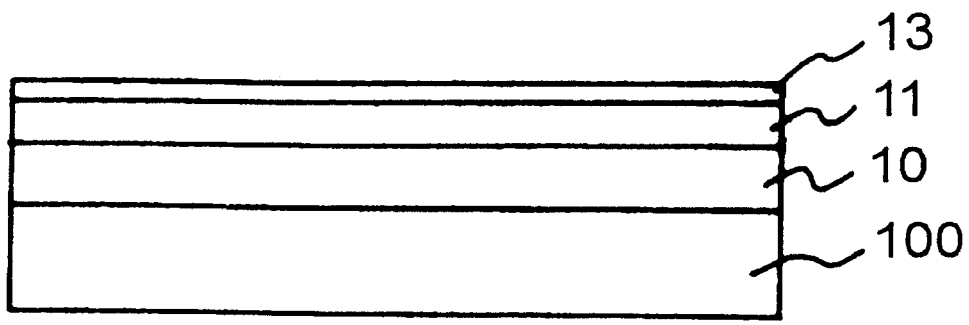
FIGS. 1A and 1B shows a schematic cross-sectional view of crystallizing silicon according to the related art.
Figure 1B:
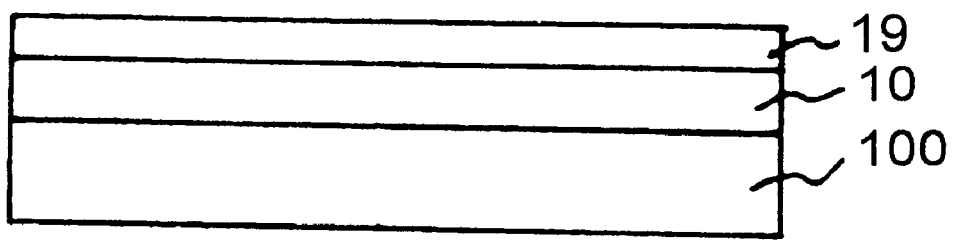
Figure 2:
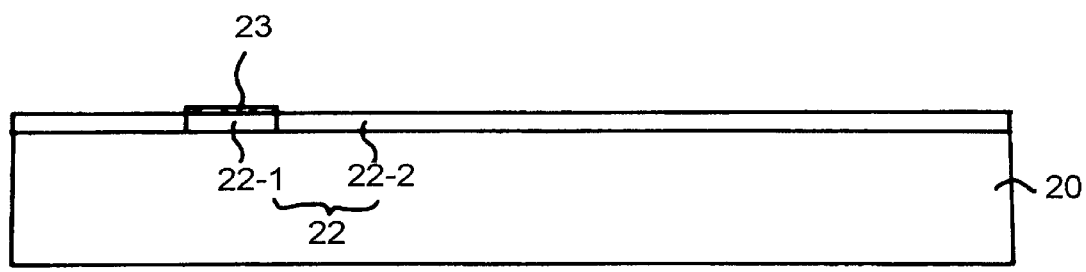
FIG. 2 shows a schematic cross-sectional view of crystallizing silicon according to a related art.
Figure 3:
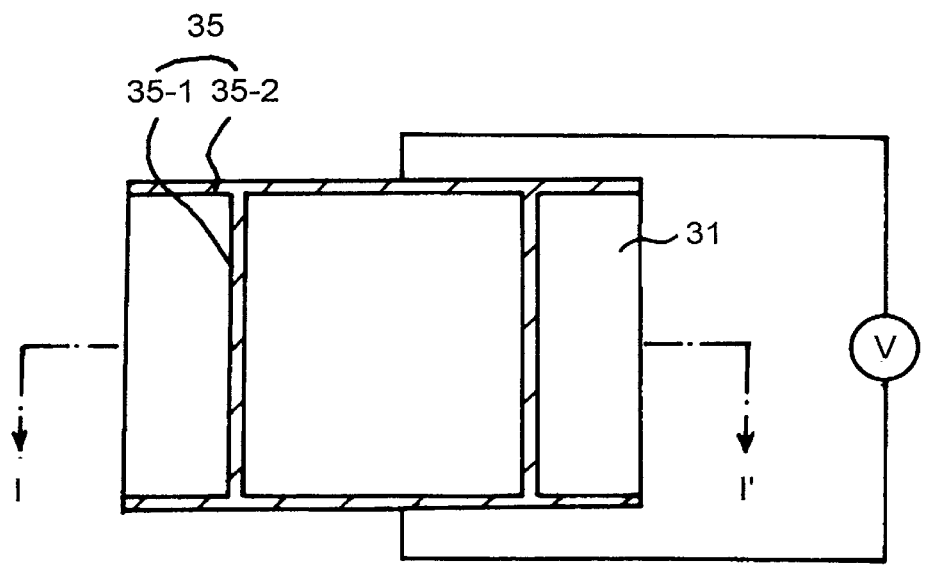
FIG. 3 shows a schematic overhead layout of crystallizing silicon according to a first preferred embodiment of the present invention.

FIG. 3 shows a schematic overhead layout of crystallizing silicon according to a first preferred embodiment of the present invention.

Referring to FIG. 3, a resistive heat generating conductive layer 35 pattern is formed on a amorphous silicon layer 31.

After an amorphous silicon film 31 to be crystallized has been deposited on an insulating substrate, a predetermined pattern of a heat generating conductive layer 35 is formed on the amorphous silicon film 31. The heat generating conductive layer 35 is constructed and arranged to supply heat to the amorphous silicon film 31.

The heat generating conductive layer 35 may be formed of a metal such as Ni, Cr, Pd, or other suitable metal, or a transparent conductive substance having excellent electric current conductivity. In FIG. 3, heat generating pattern 35-1 is arranged to have a predetermined interval to supply the amorphous silicon film with heat directly, and a connecting pattern 35-2 connecting the heat generating pattern 35-1 to an outside power supply is connected to both ends of the heat generating pattern 35-1.

Electric current flows through the resistive heat generating conductive layer 35 by applying voltage to both ends of the heat generating conductive layer 35. In this case, the outside power supply supplies the heat generating conductive layer 35 with AC or DC power.

Once electric current starts to flow through the heat generating conductive layer 35, a temperature of a substance adjacent to the heat generating conductive layer 35 increases. Joule's law, which is the principle of conservation of energy, verifies the fact that electric energy transforms into thermal energy and is defined below:

P(power)=V²(applied voltage)/R(resistance of an a resistive heat generating conductive substance) [J/s]

In this case, heat generated from the resistive heat generating conductive layer 35 is transferred to a portion of the amorphous silicon film 31 which is not in contact with the heat generating conductive layer 35 as well as another portion of the amorphous silicon film 31 contacted with the heat generating conductive layer, thereby increasing the temperature of the whole silicon film to greatly expedite the silicon crystallization.

Therefore, it is not necessary to have the heat generating conductive layer be arranged in contact with the amorphous silicon film directly. Thus, an insulating layer may be inserted between the heat generating conductive layer 35 and the amorphous silicon film 31.

Accordingly, the pattern of the heat generating conductive layer 35 has no limitation in shape or configuration as long as the heat generating conductive layer 35 as a heat supply is placed at a location which enables the heat generating conductive layer 35 to increase the temperature of the amorphous silicon film 31. The pattern is preferably defined to have electric current flow through the heat generating conductive layer 35.

Figure 4:
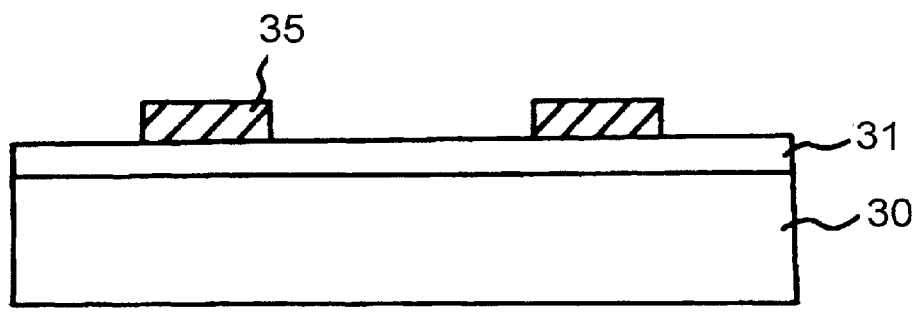
FIG. 4 shows a schematic cross-sectional view of crystallizing silicon according to a second preferred embodiment of the present invention.

FIG. 4 shows a schematic cross-sectional view of a process for crystallizing silicon according to a second preferred embodiment of the present invention wherein a first sample showing the cross-sectional locations of the heat generating conductive layer and the amorphous silicon film is shown.

Referring to FIG. 4, an amorphous silicon film 31 is formed on a substrate 30, and a resistive heat generating conductive layer 35 is formed on the amorphous silicon film 31.

In the above structure, once electric current starts to flow through the heat generating conductive layer 35, a temperature of a substance adjacent to the heat generating conductive layer 35 increases so as to crystallize the amorphous silicon film 31.

In this case, the heat generating conductive layer 35 may be formed of a metal such as Ni, Cr, Pd, or other suitable metal, or a transparent conductive substance having excellent electric current conductivity such as ITO and $SnO_2$, doped amorphous silicon or plasma-treated amorphous silicon.

In the second preferred embodiment of the present invention, the effect of MILC is achieved provided that the heat generating conductive layer 35 is formed of a conductive substance which works as a catalyst for silicon crystallization. The heat generating conductive layer 35 may be formed of one of Cu, Ni, Fe, Co, Ru, Rh, Pd, Os, Ir, Pt, Sc, Ti, V, Cr, Mn, Zn, Au, Ag, or other suitable materials. In this case, the amorphous silicon contacted with the heat generating conductive layer 35 is crystallized by MIC, while the other amorphous silicon which is not contacted with the metal layer 35 located laterally from the crystallized region is crystallized by MILC.

Figure 5A:
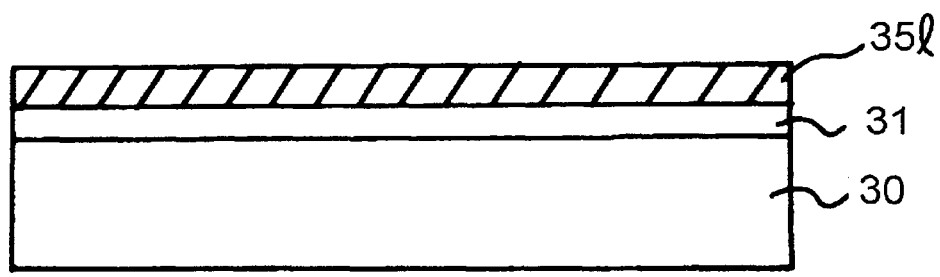
FIG. 5A to FIG. 5B show cross-sectional views for explaining a first example of the second preferred embodiment of the present invention.
Figure 5B:
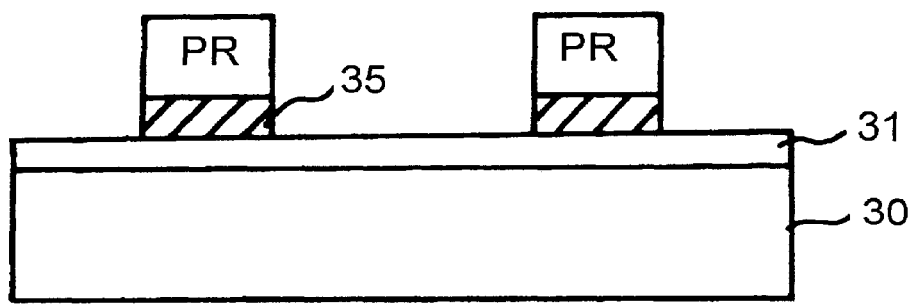

FIG. 5A to FIG. 5B show cross-sectional views for explaining a first example of the second preferred embodiment of the present invention.

Referring to FIG. 5A, an amorphous silicon film 31 is deposited on a substrate 30 via CVD or other suitable process. Then, a conductive layer 35l for forming a heat generating conductive layer is formed on the amorphous silicon layer 31.

Referring to FIG. 5B, a photoresist pattern PR having a predetermined shape is formed on the conductive layer 35l for forming a heat generating conductive layer. Then, a heat generating conductive layer 35l having a desired pattern is formed by etching the conductive layer 35l while using the photoresist pattern PR as a mask.

The pattern of the heat generating conductive layer, as shown in FIG. 3, is preferably arranged not to have electric current flow all over the heat generating conductive layer 35l.

A portion of the amorphous silicon film may be etched by an etchant used to etch the conductive layer for forming the heat generating conductive layer while the conductive layer for forming the heat generating conductive layer is being etched.

Figure 6A:
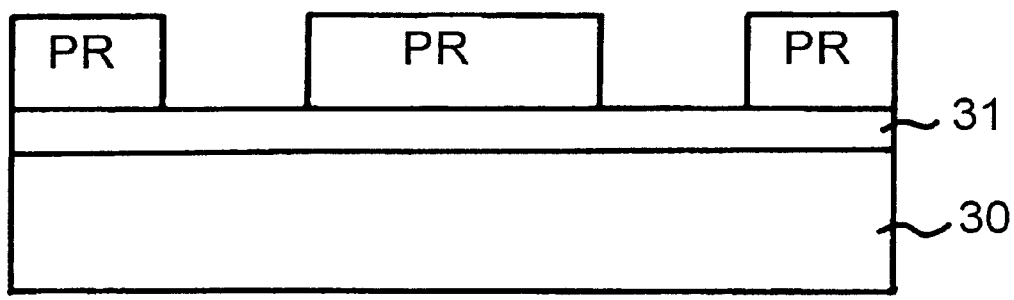
FIG. 6A to FIG. 6B show cross-sectional views for explaining a second example of the second preferred embodiment of the present invention.
Figure 6B:
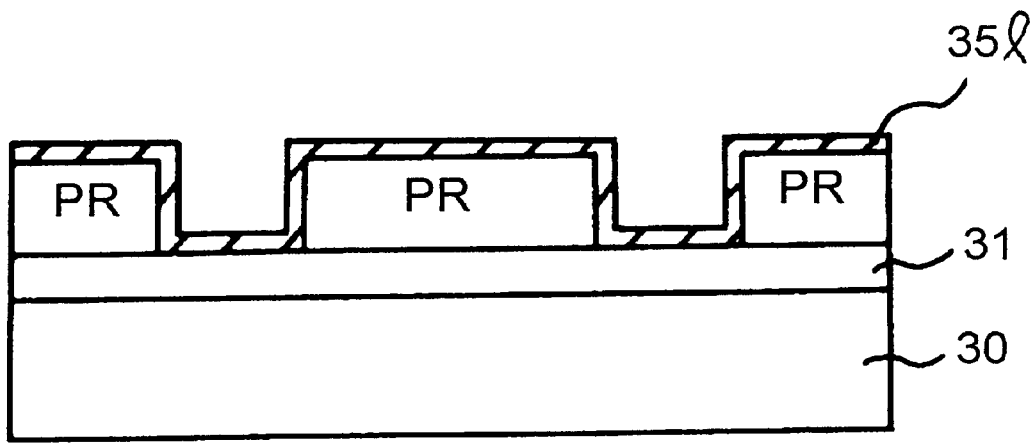

FIG. 6A to FIG. 6B show cross-sectional views for explaining a second example of the second preferred embodiment of the present invention.

Referring to FIG. 6A, an amorphous silicon film 31 is deposited on a substrate 30 via CVD or other suitable process. Then, a photoresist pattern PR is defined on the amorphous silicon layer 31. The photoresist pattern PR exposes an open portion where a heat generating conductive layer is to be formed.

Referring to FIG. 6B, a conductive layer 35l for defining a heat generating conductive layer is deposited on an exposed surface of the substrate including the photoresist pattern PR.

Then, a heat generating conductive layer 35, as shown in FIG. 3, is formed on the amorphous silicon film 31 by removing the photoresist pattern PR and a portion of the conductive layer 35l. Portions of the heat generating conductive layer 35l in contact with the photoresist pattern PR are removed by the known technique lift-off.

Figure 7:
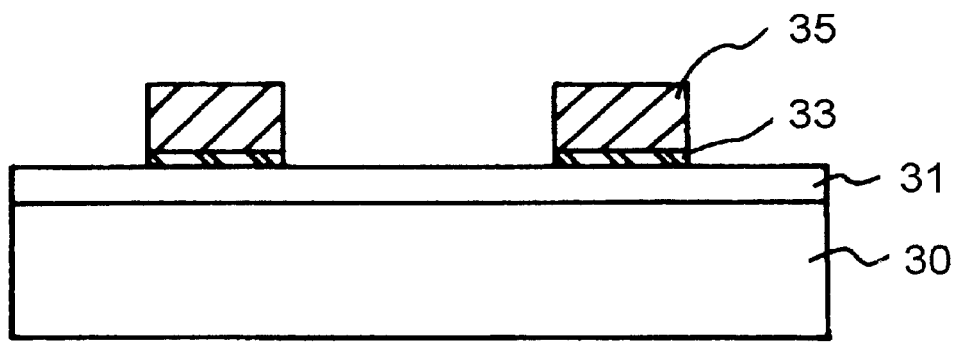
FIG. 7 shows a schematic cross-sectional view of crystallizing silicon according to a third preferred embodiment of the present invention.

FIG. 7 shows a schematic cross-sectional view of crystallizing silicon according to a third preferred embodiment of the present invention, wherein a second example of a sample illustrating the cross-sectional portions of a heat generating conductive layer and an amorphous silicon film.

Referring to FIG. 7, an amorphous silicon film 31 is formed on a substrate 30. A metal layer 33 working as a catalyst for expediting silicon crystallization and a heat generating conductive layer 35 are formed on the amorphous silicon film 31.

The heat generating conductive layer 35 may be formed of a metal such as Ni, Cr, Pd, or other suitable metal, a transparent conductive substance, doped amorphous silicon or plasma-treated amorphous silicon. The metal layer 33 functioning as a catalyst for silicon crystallization may be formed of one of metals such as Cu, Ni, Fe, Co, Ru, Rh, Pd, Os, Ir, Pt, Sc, Ti, V, Cr, Mn, Zn, Au, Ag, or other suitable metals.

Once voltage is applied to the heat generating conductive layer 35, heat is generated by the heat generating conductive layer 35. Then, the heat is transferred to the metal layer 33 and increases the temperature of the amorphous silicon film 31 in an area around the metal layer 33. In this case, the amorphous silicon film is crystallized by being heated up by the heat generated by the layer 35, to a predetermined temperature, for example up to about 500 degrees Celsius, by controlling the voltage applied to the heat generating conductive layer 35.

In this case, the amorphous silicon in contact with the metal layer 33 is crystallized by MIC, while the other amorphous silicon which is not in contact with the metal layer located laterally from the crystallized region is crystallized by MILC.

In the above structure of the third preferred embodiment of the present invention, the amorphous silicon crystallization may be carried out by preparing a sample including an insulating layer covering the heat generating conductive layer 35 and metal layer 33.

Figure 8:
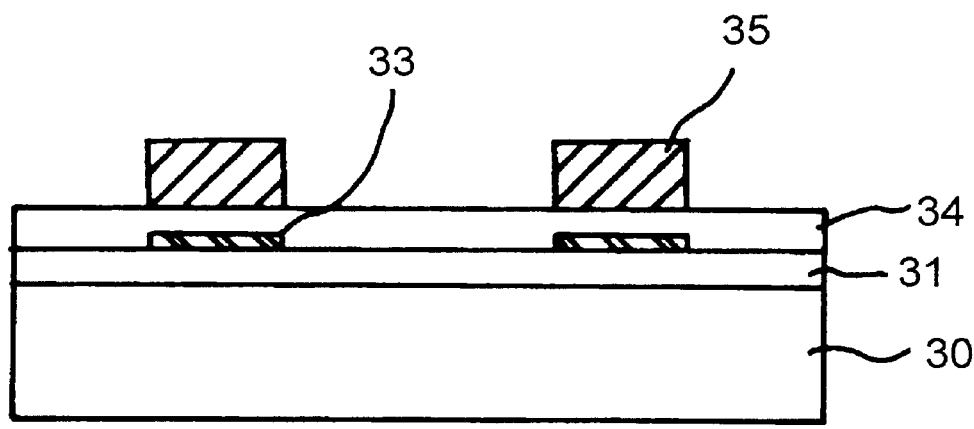
FIG. 8 shows a schematic cross-sectional view of crystallizing silicon according to a fourth preferred embodiment of the present invention.

FIG. 8 shows a schematic cross-sectional view of crystallizing an amorphous silicon film according to a fourth preferred embodiment of the present invention, wherein a third example of a sample showing the cross-sectional portions of a heat generating conductive layer and an amorphous silicon film.

Referring to FIG. 8, an amorphous silicon film 31, a metal layer 33 accelerating the silicon crystallization, an insulating layer 34, and a heat generating conductive layer 35 are formed on a substrate 30, successively.

Once voltage is applied to the heat generating conductive layer 35, heat is generated by the heat generating conductive layer 35. Then, the heat increases the temperature of the insulating layer 34 and the amorphous silicon film 31 around the heat generating layer 35. In this case, the amorphous silicon film is crystallized by being heated up by the heat generated by the layer 35, to a predetermined temperature, for example up to about 600 degrees Celsius, by controlling the voltage applied to the heat generating conductive layer 35.

In this case, the heat generated from the heat generating conductive layer 35 is transferred to the amorphous silicon film 31 through the insulating layer 34. In the third preferred embodiment of the present invention, the crystallization by MIC is achieved as explained in the second preferred embodiment of the present invention.

As an alternative to the structure of the sample shown in FIG. 8, the silicon crystallization of the amorphous silicon film can be achieved by preparing a sample where the heat generating conductive layer 35 is inserted between the amorphous silicon film and the insulating layer.

Figure 9:
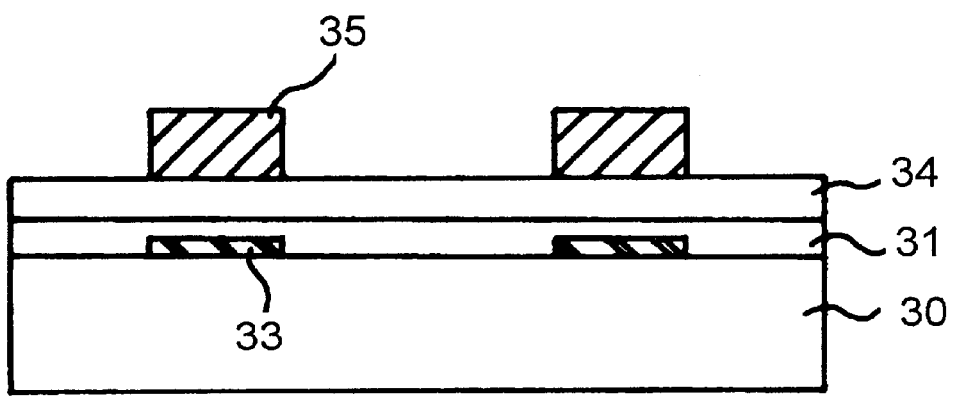
FIG. 9 shows a schematic cross-sectional view of crystallizing silicon according to a fifth preferred embodiment of the present invention.

FIG. 9 shows a schematic cross-sectional view of crystallizing an amorphous silicon film according to a fifth preferred embodiment of the present invention, wherein a fourth example of a sample showing the cross-sectional portions of a heat generating conductive layer and an amorphous silicon film.

Referring to FIG. 9, a metal layer 33 accelerating the silicon crystallization, an amorphous silicon film 31 covering the metal layer 33, an insulating layer 34, and a heat generating conductive layer 35 are formed on a substrate 30, successively.

Once voltage is applied to the heat generating conductive layer 35, heat is generated by the heat generating conductive layer 35. Then, the heat increases the temperature of the amorphous silicon film 31 around the heat generating layer 35. In this case, the amorphous silicon film is crystallized by being heated up by the heat generated by the layer 35, to a predetermined temperature which causes no damage on the substrate by controlling the amount of voltage applied to the heat generating conductive layer 35.

In this case, the heat generated by the heat generating conductive layer 35 is transferred to the amorphous silicon film 31 through the insulating layer 34. Therefore, it is desirable for forming a very thin insulating layer 34. In the fifth preferred embodiment of the present invention, the crystallization by MIC is achieved as explained in the second preferred embodiment of the present invention.

The present invention achieves the silicon crystallization at a low or a room temperature within a furnace or an area surrounding the substrate and layers formed thereon, by increasing a temperature of an amorphous silicon film.

Figure 10A:
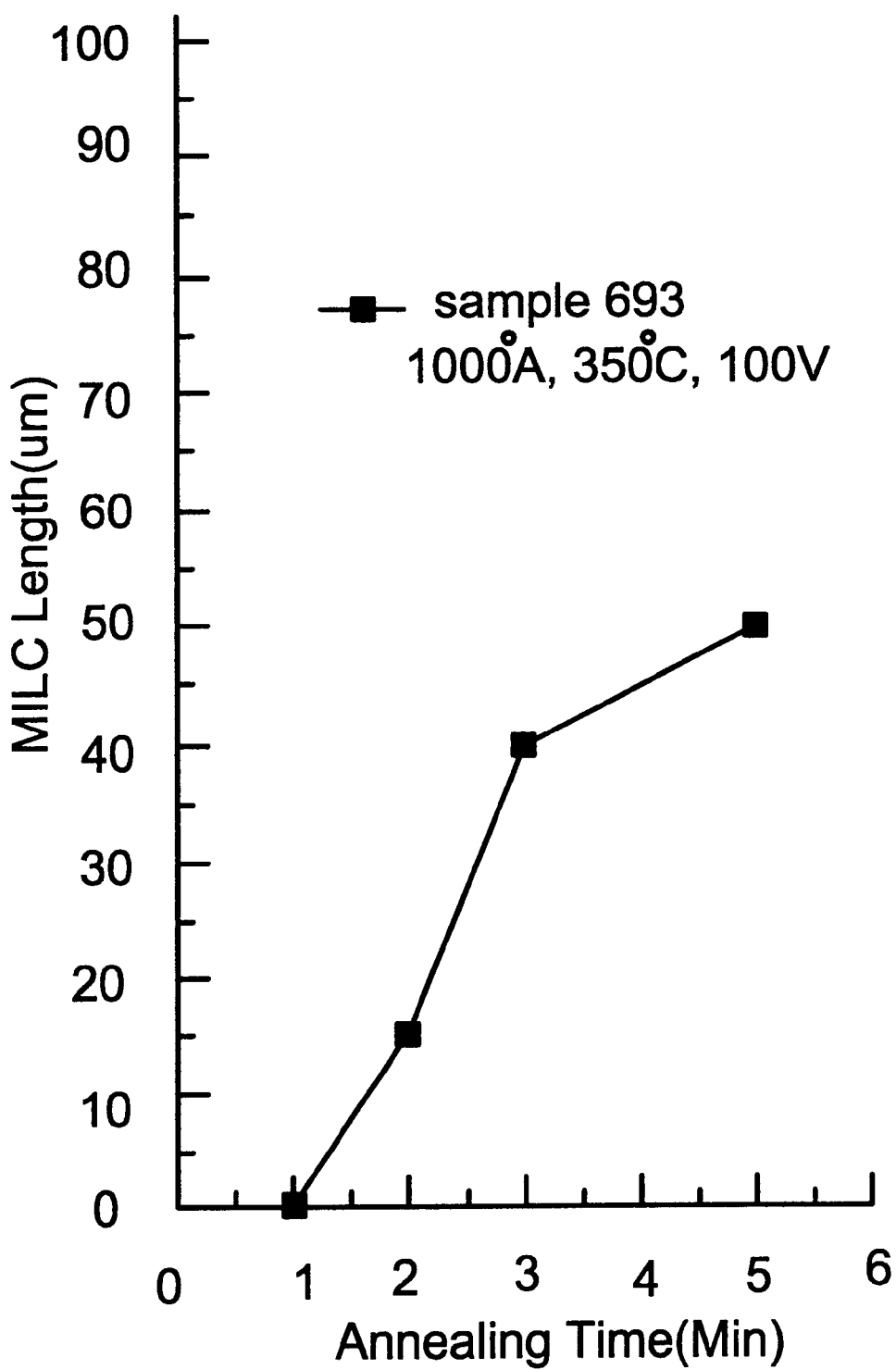
FIG. 10A and FIG. 10B show result graphs of MILC and crystallization speed after silicon crystallization of a sample of the second preferred embodiment of the present invention.
Figure 10B:
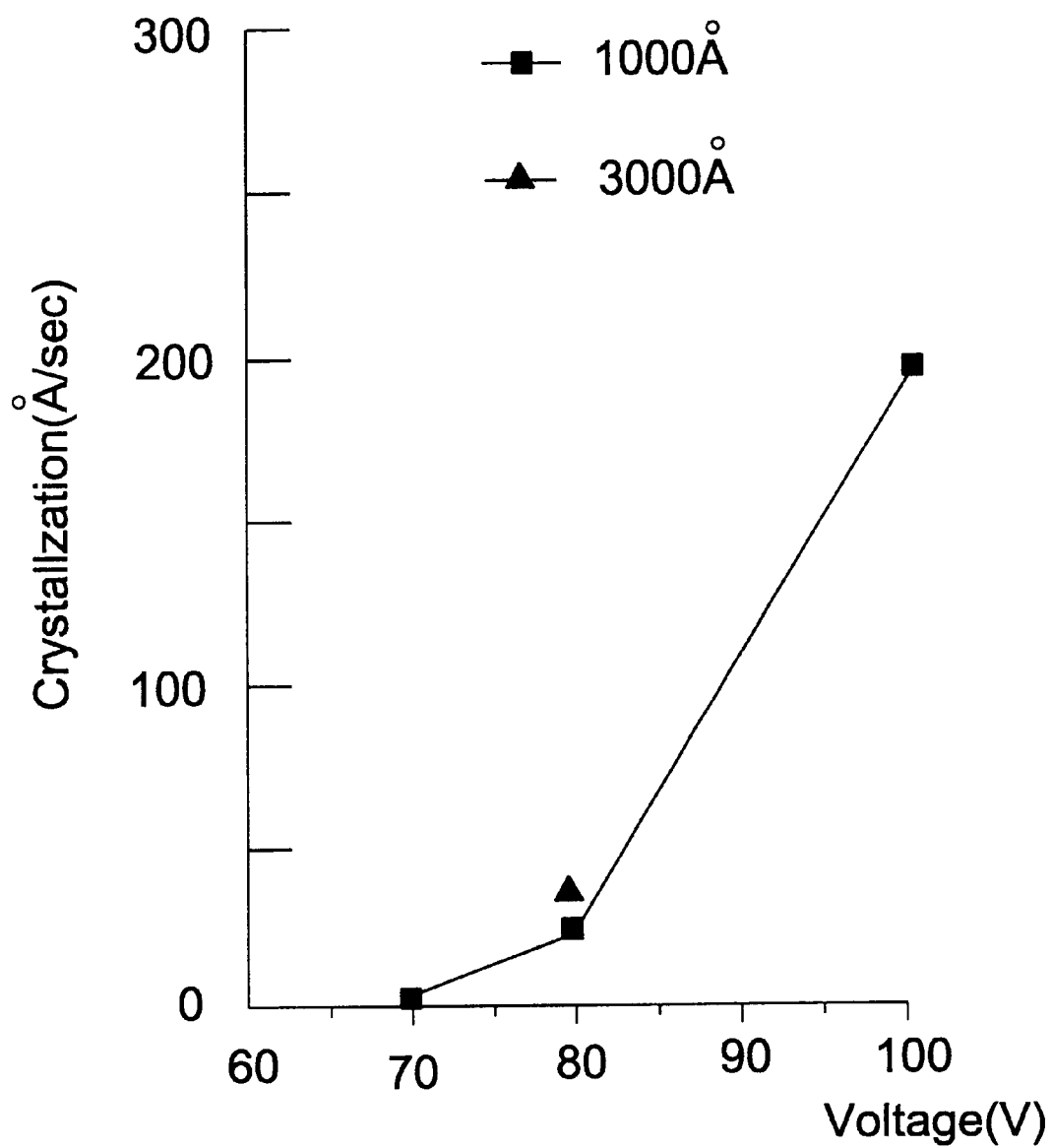

FIG. 10A and FIG. 10B show result graphs of MILC and crystallization speed after silicon crystallization of a sample of the second preferred embodiment of the present invention, wherein a heat generating conductive layer is formed of Cr and NiCr is used for the metal accelerating the silicon crystallization and wherein the temperature of a furnace is maintained 350 degrees Celsius.

Referring to FIG. 10A and FIG. 10B, when an amorphous silicon film having a thickness of 1000 angstroms is crystallized by applying 100 V, the silicon crystallization is achieved by MILC for 50 μm thick within about 5 hours. The speed of silicon crystallization is proportional to the voltage applied to the heat generating conductive layer. Therefore, the silicon crystallization is achieved very quickly by controlling the magnitude of the applied voltage properly.

Figure 11:
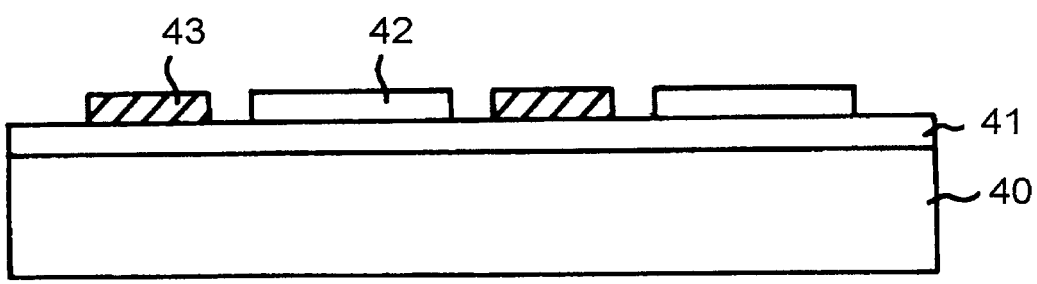
FIG. 11 shows a schematic cross-sectional view illustrating silicon crystallization according to a sixth preferred embodiment of the present invention.

FIG. 11 shows a schematic cross-sectional view of crystallizing an amorphous silicon film according to a sixth preferred embodiment of the present invention, wherein a fifth example of a sample showing the cross-sectional portions of a heat generating conductive layer and an amorphous silicon film.

Referring to FIG. 11, an insulating layer 41 is deposited on a substrate 40, and an amorphous silicon film 42 and a heat generating conductive layer 43 are formed on the insulating layer 41 in the same plane.

Once voltage is applied to the heat generating conductive layer 43, heat is generated by the heat generating conductive layer 43. Then, the heat is transferred to the insulating layer 41 adjacent to the heat generating conductive layer 43 and the space around the layer 43. The transferred heat is transferred again to the amorphous silicon film 42 in contact with the insulating layer 41, increasing the temperature of the amorphous silicon film to be crystallized.

In this case, the heat generating conductive layer may be formed of a metal such as Ni, Cr, Pd, or other suitable metal, a transparent conductive substance, doped amorphous silicon or plasma-treated amorphous silicon.

As explained in the above-described preferred embodiments of the present invention, the stacked structure of the heat generating conductive layer and the amorphous silicon film is modified variously since heat from the heat generating conductive layer enables to increase the temperature of the surrounding substances arranged in contact with the heat generating conductive layer up to a predetermined degree.

Figure 12:
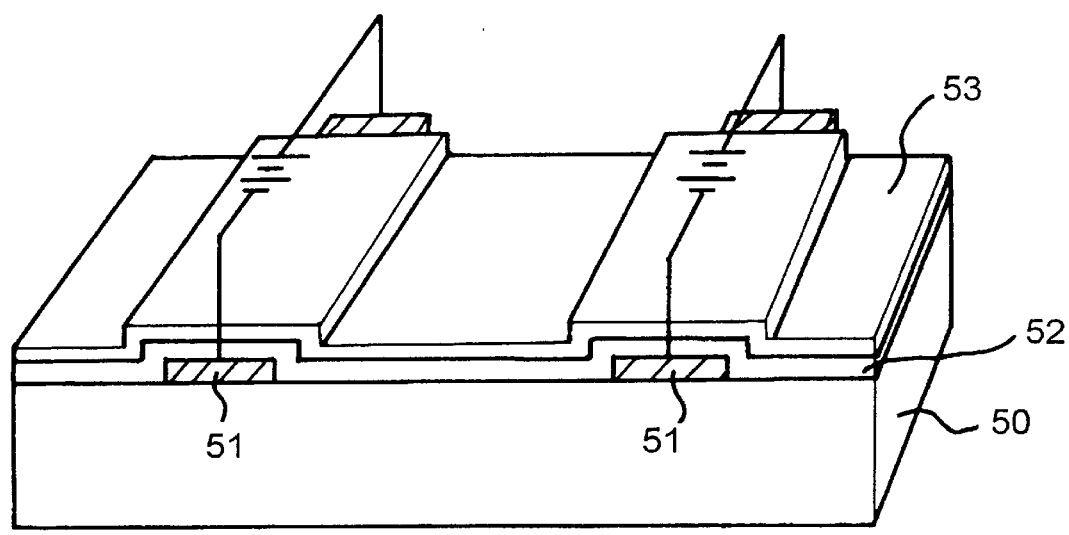
FIG. 12 shows gate patterns in an LCD to which the silicon crystallization according to a seventh preferred embodiment of the present invention is applied.

FIG. 12 shows gate patterns in an LCD to which the method of crystallizing the amorphous silicon film according to a seventh preferred embodiment of the present invention is applied.

Referring to FIG. 12, gate lines 51 are formed on an insulating substrate 50. An insulating layer 52 and an amorphous silicon film 53 are formed on the above structure. The method of silicon crystallization is applied to the resultant structure.

Once a predetermined voltage is applied to the gate lines 51, heat is generated by the gate lines 51. Then, the heat is transferred to the insulating layer 52 near the gate lines 51 and the amorphous silicon film 53. In this case, the amorphous silicon film is crystallized by being heated via controlling the amount of voltage applied to the gate lines 51. The gate lines are used as a heat generating conductive substance. Instead, data lines or other metal lines may be used as the heat generating conductive substance to greatly expedite the silicon crystallization of the present invention.

Figure 13A:
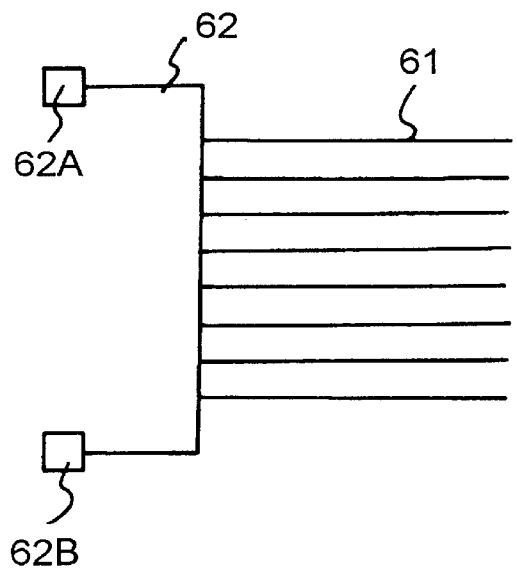
FIG. 13A and FIG. 13C shows a schematic view of gate patterns for explaining a method of manufacturing an LCD according to an eighth preferred embodiment of the present invention.
Figure 13B:
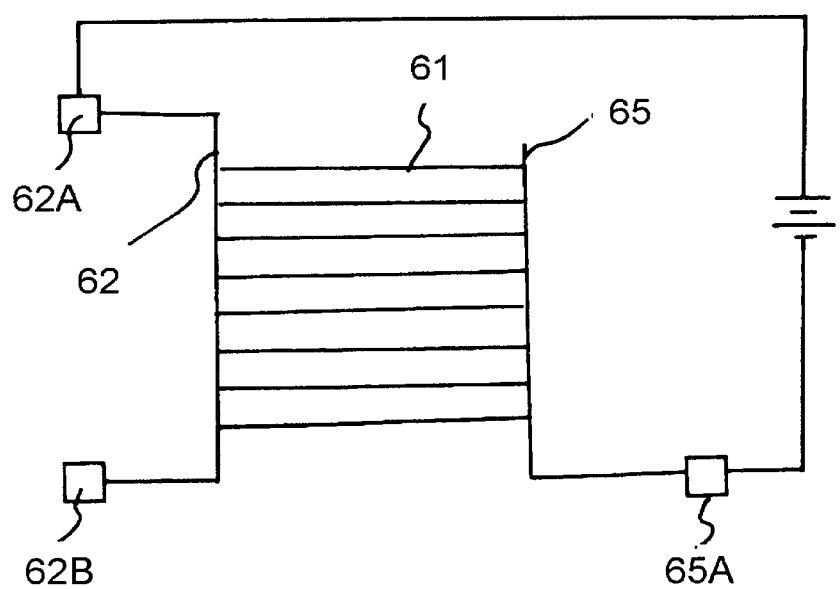
Figure 13C:
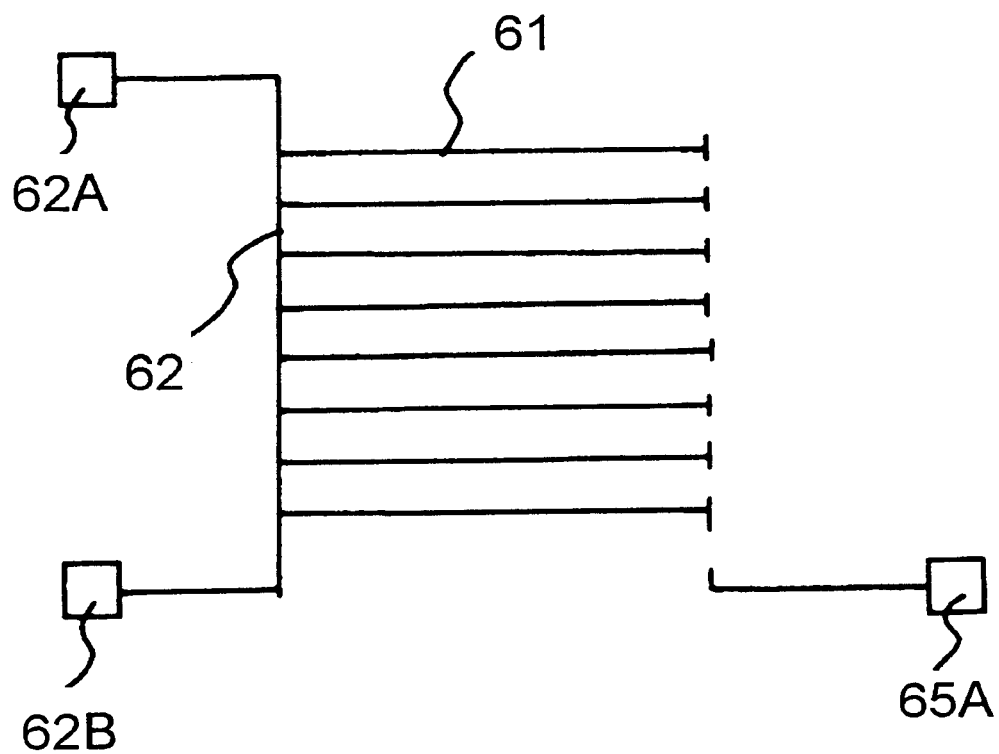

FIG. 13A and FIG. 13C show a schematic view of gate line patterns for explaining a method of manufacturing an LCD according to an eighth preferred embodiment of the present invention, wherein the gate line patterns are used as an heat generating conductive substance.

Referring to FIG. 13A, in an LCD panel, a plurality of gate lines 61 are arranged in parallel and each gate line 61 is connected to a test electrode 62 in common. The test electrode 62 is used for a passage through which test signals are transferred to each of the gate lines 61 when the LCD panel is tested after manufacturing is completed. After the completion of the test, the test electrode 62 is removed.

The elements 62A and 62B, which are not explained in the description, are test electrode pads for inputting test signals to the test electrode 62.

Unfortunately, the above-mentioned structure fails to have electric current flow through each of the gate lines 61 when a predetermined voltage is applied to the test electrode pads 62A and 62B. Thus, it is unable to crystallize the amorphous silicon film by having the gate lines generate heat.

Referring to FIG. 13B, a connecting bar 65 connecting all of the gate lines 61 in common is added to the structure including the gate lines 61 and the test electrode 62 in FIG. 13A to solve the problem explained in FIG. 13A.

Because electric current can flow through each of the gate lines 61 by applying predetermined voltage between one of the test electrode pads and a connecting bar pad 65A, heat is generated by the gate lines 61. Therefore, the amorphous silicon film near the gate lines or on the substrate is crystallized much more quickly and easier than the prior art methods.

Besides, data lines or other metal lines may be used as the heat generating conductive substance to achieved the expedited silicon crystallization of the present invention.

After the completion of the amorphous silicon crystallization, each of the gate lines 61 which are shorted by themselves should be cut off so as to be separated from one another.

Referring to FIG. 13C, each of the gate lines are isolated electrically by removing the portions of the connecting bar which connects the gate lines to one another. The result of the structure of the test electrode and the gate lines is shown in FIG. 13c.

FIG. 14A to FIG. 14E show cross-sectional views of a method of manufacturing an LCD according to a ninth preferred embodiment of the present invention, wherein a TFT part of a pixel array, a connecting bar, and a test electrode pad are shown in order from the left of each of these drawings.

Figure 14A:
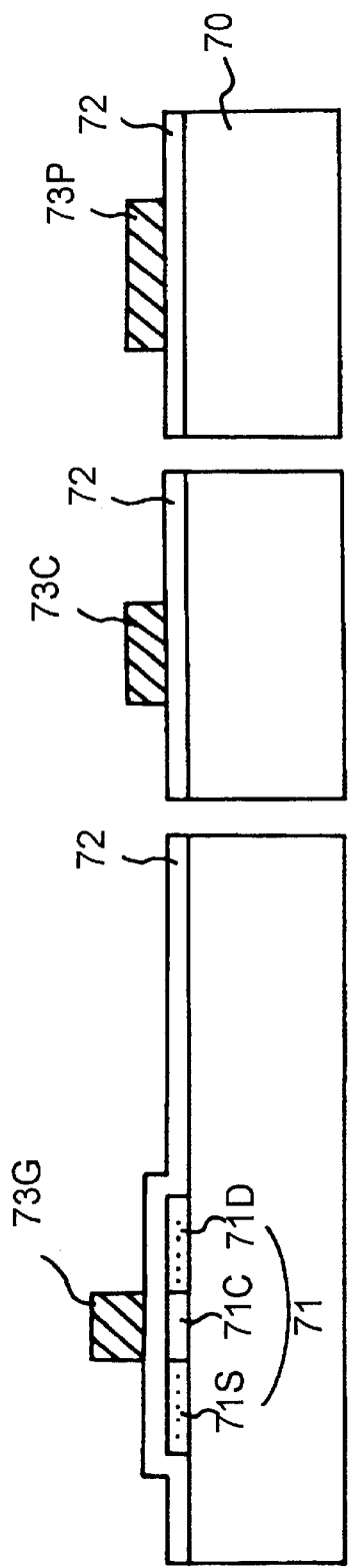

Referring to FIG. 14A, after an amorphous silicon film has been deposited on an insulating substrate 70, an active layer 71 of amorphous silicon is formed by photolithography. Then, a first insulating layer 72 covering the active layer 71 and an exposed surface of the substrate is deposited.

After a first conductive layer has been deposited on the first insulating layer 72, a gate line 73G including a gate electrode, a connecting bar 73C, a connecting bar pad (not shown in the drawing), a test electrode (not shown in the drawing), and a test electrode pad 73P are formed, preferably via photolithography. Patterns of the gate line 73G, the connecting bar 73C, the connecting bar pad (not shown), the test electrode(not shown), and the test electrode pad 73P are as shown in FIG. 13B.

Source and drain regions 71S and 71D are formed in the active layer 71 by implanting impurities into the whole exposed surface while using the gate electrode 73G as a mask and a channel region 71C is defined. These steps are performed by a conventional method.

Figure 14B:
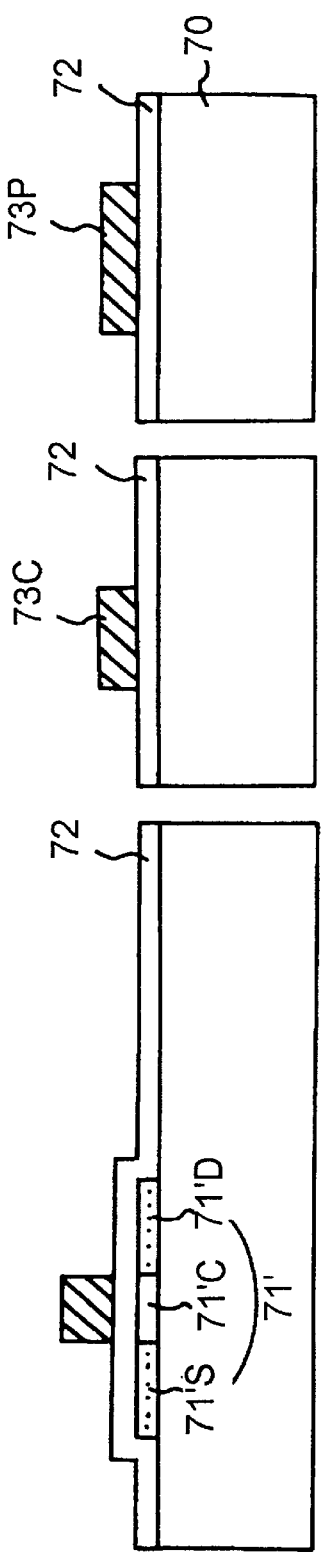

Referring to FIG. 14B, electric current is transmitted into the gate line 73G by applying a predetermined voltage between the exposed test electrode pad 73P and the connecting bar pad (not shown).

As a result, heat is generated by the gate line 73G and is transferred to the active layer 71 of amorphous silicon, thereby greatly increasing the temperature to crystallize the amorphous silicon. Therefore, an active layer 71' having a polycrystalline silicon state is provided.

Reference numerals 71'S, 71'D, and 71'C indicate source, drain, and channel regions in the active layer of polycrystalline silicon.

Referring to FIG. 14C, after a second insulating layer 74 covering the whole top surface of the substrate has been deposited, the source region 71'S, the drain region 71'D, the connecting bar pad (not shown) or the connecting bar pad and connecting bar 73C, and the test electrode pad 73P are exposed by etching the second insulating layer 74 or the second and first insulating layers 74 and 72, preferably via photolithography.

Referring to FIG. 14D, after a second conductive layer covering the top surface of the substrate has been formed, a photoresist pattern covering portions of the second conductive layer over the source/drain and the test electrode pad 73P is defined. Then, source and drain electrodes 75S and 75D and a first test cover layer 75P are formed by etching the second conductive layer while using the photoresist pattern as a mask.

In this case, when the connecting bar 73C is made of the same substance as that used to form the second conductive layer, the connecting bar 73C is also removed during the process of etching the second conductive layer. Besides, when the connecting bar 73C is made of a substance that is vulnerable to the etchant used for etching the second conductive layer, the connecting bar 73C is also removed during the process of etching the second conductive layer.

Otherwise, an additional step of removing the connecting bar is carried out when the connecting bar is made of neither the same substance of the second conductive layer nor the substance which is not etched by the etchant of the second conductive layer.

Figure 14E:
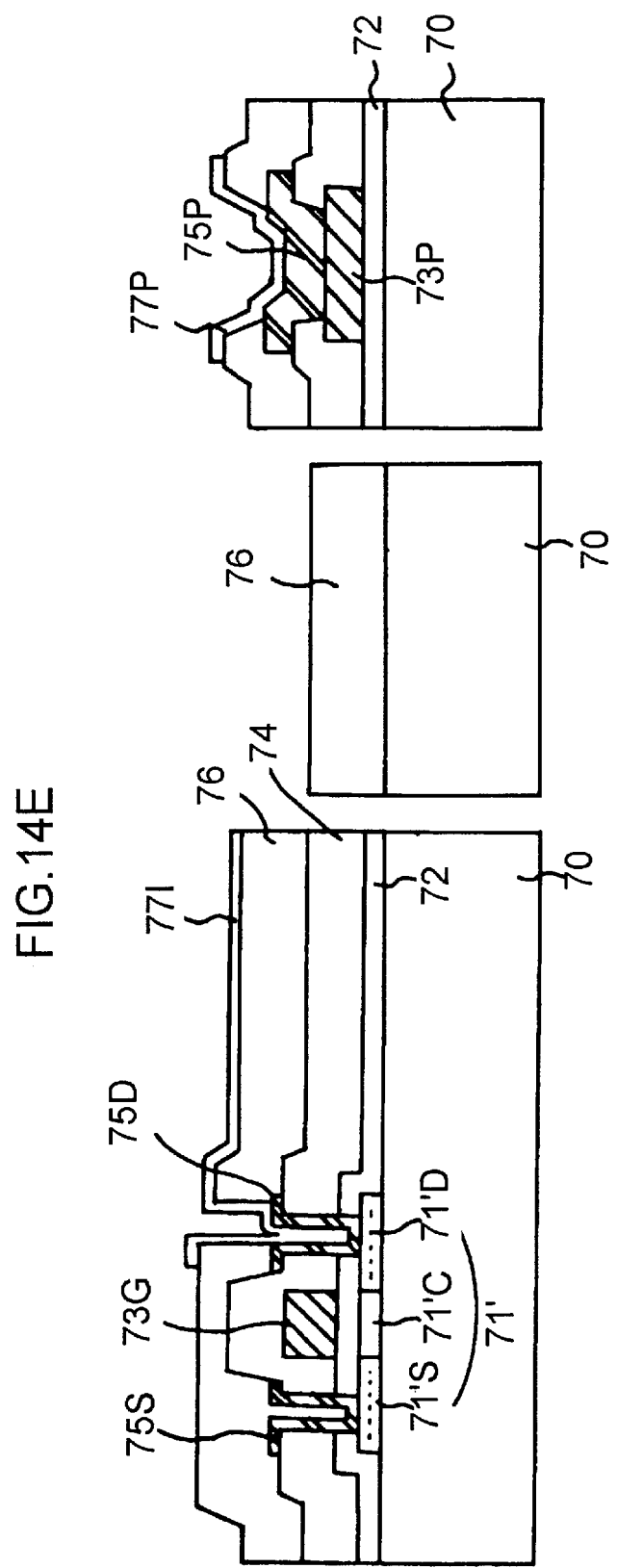

Referring to FIG. 14E, a third insulating layer 76 is deposited on the top surface of the substrate. Portions of the drain electrode 75D and the first test cover layer 75P are exposed preferably via photolithography.

After a transparent conductive layer has been deposited over the substrate, a second test cover layer 77P covering the first test cover layer 75P and a pixel electrode 77I connected to the drain electrode 75D are formed preferably via photolithography.

FIG. 15A to FIG. 15F show cross-sectional views of a method of manufacturing an LCD according to a tenth preferred embodiment of the present invention, wherein a TFT part of a pixel array, a connecting bar, and a test electrode pad are shown in order from the left of each of the drawings.

Referring to FIG. 15A, after a first conductive layer has been deposited on an insulating substrate 80, a gate line 81G including a gate electrode, a connecting bar 81C connecting gate lines, a connecting bar pad (not shown in the drawing) at one end of the connecting bar, a test electrode (not shown in the drawing), and a test electrode pad 81P are formed preferably via photolithography. Patterns of the gate line, the connecting bar, the connecting bar pad, the test electrode, and the test electrode pad are as shown in FIG. 13B.

Referring to FIG. 15B, a first insulating layer 82 covering the top surface of the substrate is deposited.

After an amorphous silicon film and a doped amorphous silicon film have been deposited on the first insulating layer 82, an ohmic contact layer 84 and an active layer 83 are formed by carrying out photolithography on the films successively.

Referring to FIG. 15C, portions of the test electrode pad 81P and the connecting bar 81C including the connecting bar pad are exposed by etching the first insulating layer 82 preferably via photolithography.

Referring to FIG. 15D, as explained regarding FIG. 13B, electric current is transmitted into the gate line 81G by applying a predetermined voltage between the exposed test electrode pad 81P and the connecting bar pad (not shown).

As a result, heat is generated by the gate line 81G. The heat is transferred to the active layer 83 and the ohmic contact layer 84 of amorphous silicon, increasing the temperature to crystallize the amorphous silicon. Therefore, an active layer 83' and an ohmic contact layer 84' having polycrystalline silicon states are provided.

Figure 15E:
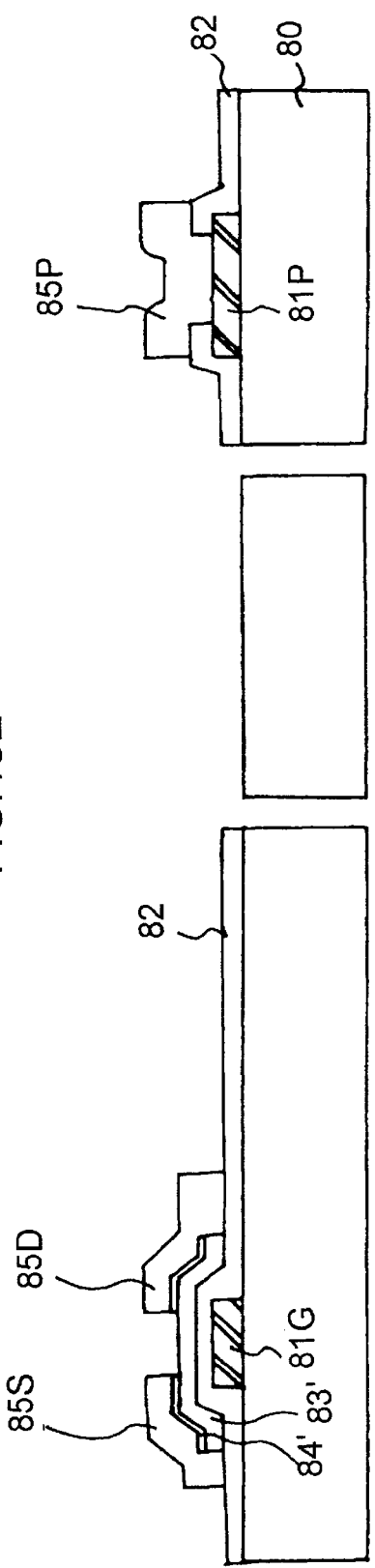

Referring to FIG. 15E, after a second conductive layer covering the top surface of the substrate has been formed, a photoresist pattern covering portions of the second conductive layer over the source/drain and the test electrode pad 81P are defined. Then, source and drain electrodes 85S and 85D and a first test cover layer 85P are formed by etching the second conductive layer while using the photoresist pattern as a mask.

In this case, when the connecting bar 81C is made of the same substance as that used to form the second conductive layer, the connecting bar 81C is also removed during the process of etching the second conductive layer. Besides, when the connecting bar 81C is made of a substance that is vulnerable to the etchant material used to etch the second conductive layer, the connecting bar 81C is also removed during the process of etching the second conductive layer.

Otherwise, an additional step of removing the connecting bar is carried out when the connecting bar 81C is made of neither the same substance of the second conductive layer nor the substance which is not etched by the etchant of the second conductive layer.

Then, a portion of the ohmic contact layer 84 exposed between the source and drain electrodes 85S and 85D is removed.

Figure 15F:
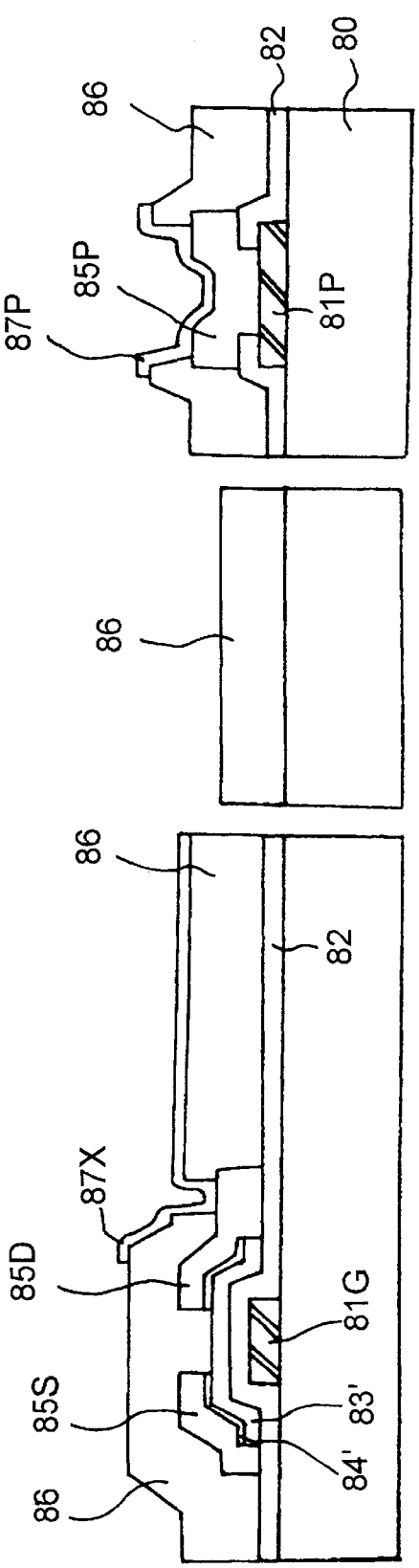

Referring to FIG. 15F, a second insulating layer 84 is deposited on the top surface of the substrate. Portions of the drain electrode 85D and the first test cover layer 85P are exposed preferably via photolithography.

After a transparent conductive layer has been deposited over the substrate, a second test cover layer 87P covering the first test cover layer 85P and a pixel electrode 87X connected to the drain electrode 85D are formed preferably via photolithography.

FIG. 16A to FIG. 16F show cross-sectional views of method of manufacturing an LCD according to a eleventh preferred embodiment of the present invention, wherein a TFT part of a pixel array, a connecting bar, and a test electrode pad are shown in order from the left of each of the drawings.

Figure 16A:
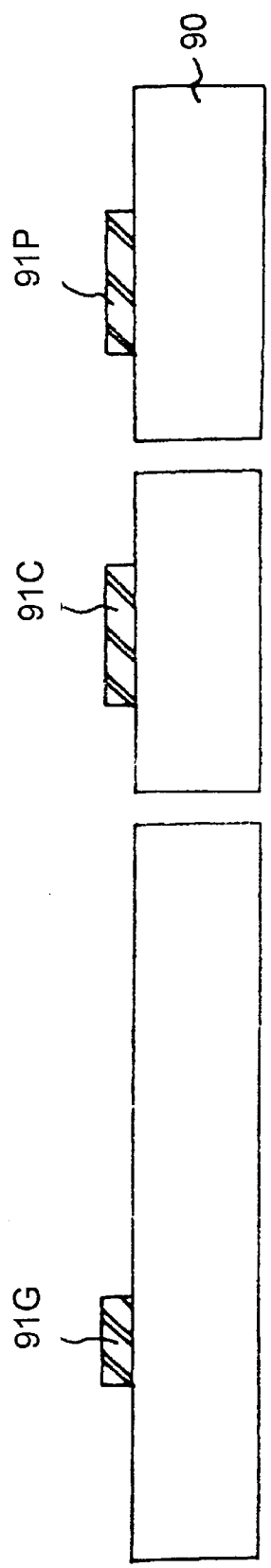

Referring to FIG. 16A, after a first conductive layer has been deposited on an insulating substrate 90, a gate line 91G including a gate electrode, a connecting bar 91C, a connecting bar pad (not shown in the drawing), and a test electrode pad 91P are formed preferably via photolithography. Patterns of the gate line, connecting bar, connecting bar pad, and test electrode pad are as shown in FIG. 9B.

Figure 16B:
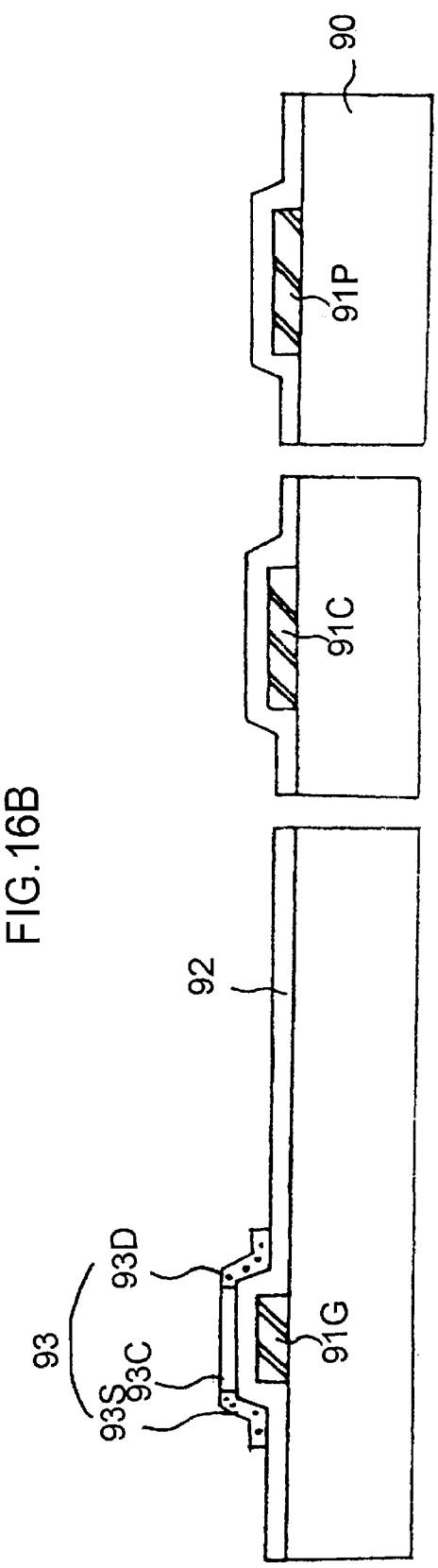

Referring to FIG. 16B, a first insulating layer 92 is deposited on the top surface of the substrate. After an amorphous silicon film has been deposited on the first insulating layer 92, an active layer is defined preferably via photolithography.

Source and drain regions 93S and 93D are formed by doping the active layer 93 selectively with n-type or p-type impurities as well as a channel region 93C is defined.

Referring to FIG. 16C, portions of the test electrode pad 91P and the connecting bar 91C including the connecting bar pad are exposed by etching the first insulating layer 92 preferably via photolithography.

Referring to FIG. 16D, as explained in FIG. 13B, electric current is flown into the gate line 91G by applying a predetermined voltage between the exposed test electrode pad 91P and the connecting bar pad (not shown).

As a result, heat is generated by the gate line 91G and is transferred to the active layer 93 of amorphous silicon, thereby increasing the temperature to crystallize the amorphous silicon. Therefore, an active layer 93 having a polycrystalline silicon state is provided.

Referring to FIG. 16E, after a second conductive layer covering the top surface of the substrate has been formed, a photoresist pattern covering portions of the second conductive layer over the source/drain and the test electrode pad 91P is defined. Then, source and drain electrodes 95S and 95D and a first test cover layer 95P are formed by etching the second conductive layer while using the photoresist pattern as a mask.

In this case, when the connecting bar 91C is made of the same substance used to form the second conductive layer, the connecting bar 91C is also removed during the process of etching the second conductive layer. Besides, when the connecting bar 91C is made of a substance that is vulnerable to the etchant of the second conductive layer, the connecting bar 91C is also removed during the process of etching the second conductive layer.

Otherwise, an additional step of removing the connecting bar is carried out when the connecting bar 91C is made of neither the same substance of the second conductive layer nor the substance which is not etched by the etchant of the second conductive layer.

Referring to FIG. 16F, a second insulating layer 96 is deposited on the top surface of the substrate. Portions of the drain electrode 95D and the first test cover layer 95P are exposed preferably via photolithography.

After a transparent conductive layer has been deposited over the substrate, a second test cover layer 97P covering the first test cover layer 95P and a pixel electrode 97X connected to the drain electrode 95D are formed preferably via photolithography.

FIG. 17 explains the silicon crystallization by using the Joule's heat of a heat generating conductive layer according to a twelfth preferred embodiment of the present invention.

Referring to FIG. 17, after a buffer layer 120 has been formed on a substrate 200, an amorphous silicon layer 121 to be crystallized is deposited on the buffer layer 120. A heat generating conductive layer 125 is formed on the amorphous silicon layer 121. Then, current is applied to the heat generating conductive layer 125 by applying voltage to both terminals of the heat generating conductive layer. In this case, either DC or AC power may be applied to the heat generating conductive layer 125.

The heat generating conductive layer 25 supplies the amorphous silicon layer 121 with Joule heat. Thus, the heat generating conductive layer 125 may be made of a metal which has relatively high resistance such as Ni, Cr, Pd and other suitable metals, transparent conductive substance such as ITO, $SnO_2$ and the like, and heat generating resistive substance such as doped amorphous silicon, plasma treated amorphous silicon, and other similar substances.

Once current passes through the heat generating conductive layer 125, Joule's heat is generated by the heat generating conductive layer 125. Then, Joule heat raises the temperature of a neighboring substance by conduction. This is verified by Joule's law of energy conservation when electric energy is transformed into heat energy.

$$P(\text{power}) = V^2(\text{applied voltage})/R(\text{resistance of a heat generating conductor})$$
$$= I^2(\text{current passing through the heat generating conductor}) \times R$$

More specifically, heat, of which calories are proportional to the square of the flowing current and the resistance of the conductor, is generated when current passes through a resistive conductor.

Joule heat of the heat generating conductive layer 125 is transferred not only to the amorphous silicon arranged to contact the heat generating conductive layer but also to the rest of the amorphous silicon layer which is not contacted with the heat generating conductive layer. Thus, the temperature of the whole amorphous silicon film is greatly increased so as to rapidly crystallize silicon. Therefore, it is not necessary for the heat generating conductive layer to be contacted with the amorphous silicon layer 121. Moreover, an insulating layer may be inserted between the heat generating conductive layer and the amorphous silicon layer. Because the heat generating conductive layer 125 works as a heat supply to the substrate, the location and pattern of the heat generating conductive layer 125 do not matter provided that the heat generating conductive layer achieves an increase in the temperature of the amorphous silicon layer.

The preferred embodiments of the present invention for crystallizing silicon by using Joule's heat of a heat generating conductive layer may be applied to the method of manufacturing an LCD.

FIG. 18 shows a schematic layout of a liquid crystal display which uses TFT's of polycrystalline silicon as switching devices according to a thirteenth preferred embodiment of the present invention.

Referring to FIG. 18, a plurality of pixels include a plurality of gate lines 132 and data lines 131 which are crossed one with another to provide a matrix formation. Each pixel has a TFT which is electrically connected to the data line 131 and the gate line 132. The TFT has an active layer 133 of polycrystalline silicon.

The active layer 133 is formed by depositing an amorphous silicon layer over a substrate, by crystallizing the amorphous silicon layer and by patterning the crystallized silicon layer by photolithography.

When the technique of crystallizing a silicon film according to preferred embodiments of the present invention is applied to an LCD, it is favorable to have the heat generating conductive layer pattern overlapped with the active layer 133 to have heat concentrated on the active layer 133 only.

For the above purpose, a heat generating conductive layer including a first resistor and a second resistor is formed to be one unitary body. In this case, resistance of the first resistor is less than that of the second resistor. Therefore, when voltage is applied to the heat generating conductive layer pattern, Joule heat of the second resistor is larger than that of the first. As a result, the amorphous silicon near the second resistor is supplied with Joule heat which is larger than the heat applied to the other amorphous silicon near the first resistor. This is explained by the formula:

$$P(\text{power}) = I^2(\text{current passing through the heat generating conductor}) \times R.$$

The present invention does not focus on supplying the whole substrate with Joule heat but focuses on concentrating heat on a portion of the active layer which needs to be crystallized. For this purpose, the heat generating conductive layer is formed to be overlapped with the high resistor. In this case, the active layer is crystallized only with the power which is less than the case of supplying the whole substrate with heat as well as the time consumed for crystallizing silicon is greatly reduced.

Considering that the area occupied by the active layer of a TFT is under 1% of the whole pixel, the power saving and the reduced time of silicon crystallization are maximized. Moreover, the damage to the substrate is minimized because the heat supply is focused on a specific site.

In this case, the temperature is increased until the crystallizing temperature of an amorphous silicon layer is reached. Thus, when the crystallization is carried out by a furnace, the crystallization is achieved even though the temperature of the furnace or the surrounding is low or room temperature.

The heat generating conductive layer pattern includes the first resistor and the second resistor having a higher resistance than the first will be explained in the following description.

FIG. 19 shows a layout explaining silicon crystallization according to a fourteenth preferred embodiment of the present invention. This drawing illustrates the pattern of an heat generating conductive layer when the crystallization is applied to an LCD.

Referring to FIG.19, first resistors R1 and second resistors R2 are determined by the area of the passageway which the charge carriers pass through in the present invention. The first and second resistors R1 and R2 are formed as a unitary body and are connected in series to each other. As shown in FIG. 19, the area of the passageway of the second resistor R2 through which the charge carriers pass is narrower than that of the first R1. A bottleneck state occurs so that Joule heat of the second resistor R2 is larger than that of the first R1.

In order to supply the amorphous silicon region to be an active layer intensively with Joule heat according to the preferred embodiment, the second resistor R2 of the heat generating conductive layer 141 is formed to overlap with the amorphous silicon region to be the active layer.

Then, the amorphous silicon layer is crystallized by generating Joule's heat by applying voltage to both ends of the heat generating conductive layer 141. After the silicon crystallization has been completed, the silicon layer is exposed by removing the heat generating conductive layer. The active layer is patterned by etching the crystallized silicon layer preferably via photolithography.

FIG. 20 shows a layout explaining silicon crystallization according to a fifteenth preferred embodiment of the present invention, which illustrates different shapes of a heat generating conductive layer.

Referring to FIG. 20, as is the case with the fourteenth preferred embodiment of the present invention, first resistors R1 and second resistors R2 are determined by the area of the passageway which the charge carriers pass through in the fifteenth preferred embodiment of the present invention. In the fifteenth preferred embodiment, each second resistor R2 stand in a raw although the first resistors R1 and second resistors R2 are formed to define a single unitary body.

As the area of the passageway of the second resistor R2 through which the charge carriers pass is narrower than that of the first R1, a bottleneck state occurs so that Joule heat of the second resistor R2 is larger than that of the first R1. Therefore, in order to supply the active layer intensively with Joule heat according to the fifteenth preferred embodiment, the second resistor R2 of the heat generating conductive layer 151 is formed to overlap with the amorphous silicon region to be the active layer.

FIG. 21 shows a cross-sectional view explaining silicon crystallization according to a sixteenth embodiment of the present invention. A first resistor R1 and a second resistor R2 are determined by the area of the passageway through which charge carriers pass in the third preferred embodiment. The sixteenth preferred embodiment is shown in a three dimensional view while the fourteenth and fifteenth preferred embodiments are shown in a two dimensional view.

A heat generating conductive layer 163, which includes a second resistor R2 on the portion of an amorphous silicon 161-2 and a first resistor R1 on another portion of the amorphous silicon is formed. In this case, the second resistor R2 generates Joule's heat, which is larger than that of the first R1 since the area of the passageway of the the second resistor R2 is narrower than that of the first resistor R1. A bottleneck state occurs at the second resistor R2 which has relatively higher resistance and produces larger Joule's heat.

After a buffer layer 160 has been formed on a substrate 600, an amorphous silicon layer 61 to be crystallized is formed on the buffer layer 160. A heat generating conductive substance layer is deposited to have a first thickness t1 on the amorphous silicon layer 161. Then, a heat generating conductive layer 163 is formed preferably by photolithography, wherein portions of the heat generating conductive substance layer are etched to the second thickness t2 which is thinner and narrower than the first thickness t1. In this case, portions of the heat generating conductive layer 163 having the first thickness t1 becomes a first resistor R1 while the remaining portions having the second thickness t2 defines a second resistor R2. Besides, the second resistor R2 is arranged to be overlapped with the amorphous silicon 161-2 to become an active layer.

Then, the crystallization of amorphous silicon is achieved by applying predetermined voltage to the heat generating conductive layer 163.

Although the above-mentioned preferred embodiment of the present invention shows the case that the heat generating conductive layer 163 is formed on the amorphous silicon layer 161, Joule heat of the heat generating conductive layer is transferred to the peripheral region as well as the amorphous silicon contacted with the heat generating conductive layer. Working as heat supply applied to the substrate, the heat generating conductive layer 163 does not have to be contacted with the amorphous silicon layer. Besides, the pattern and location of the heat generating conductive layer are free from limitation provided that temperature of the substrate is increased.

FIG. 22 shows a cross-sectional view explaining silicon crystallization according to a seventeenth preferred embodiment of the present invention. As shown in the 16th preferred embodiment of the present invention, first resistors R1 and second resistors R2 are determined by the area of the passageway which the charge carriers pass through. In the seventeenth preferred embodiment, the first resistors R1 are formed by the double resistance layers while the second resistors R2 are formed by single resistance layer.

Referring to FIG. 22, after a buffer layer 170 has been formed on a substrate 700, an amorphous silicon layer 171 to be crystallized is formed on the buffer layer 170. A first heat generating conductive substance layer 172 is deposited on the amorphous silicon layer. Then, a second heat generating conductive substance layer 173 is formed on the first heat generating conductive substance layer 172 selectively.

A second heat generating conductive substance layer 173 is formed on portions of the first heat generating conductive substance layer which is to become a first resistor R1, while the remaining portions of the first heat generating conductive substance layer which is to become a second resistor R2 is exposed. First and second resistors R1 and R2 are determined by the absence or presence of the second heat generating conductive layer 173, which controls the area of the passageway of charge carriers in the seventeenth preferred embodiment of the present invention.

As Joule heat should be concentrated on amorphous silicon 171-2 to define an active layer, the second resistors R2 of which resistance is higher than the first R1 are located on the amorphous silicon 171-2. A second heat generating conductive substance layer 173 is formed on the amorphous silicon 171-1 which is not going to be the active layer, which makes a first resistor have a relatively low resistance.

Then, the process of crystallizing amorphous silicon proceeds by applying predetermined voltage to the heat generating conductive layers 171 and 173, which is the same of the third preferred embodiment.

Accordingly, the present invention achieves a silicon crystallization at a low or a room temperature of a furnace or a surrounding environment (not a substrate) by increasing a temperature of an amorphous silicon film to be suitable for crystallization by generating heat by applying voltage to a heat generating conductive layer. Also, the present invention reduces the process time because the speed of silicon crystallization is increased by controlling the applied voltage properly.

Besides, the present invention enables manufacturing a liquid crystal display having thin film transistors including polycrystalline silicon without additional steps when metal lines are used as the heat generating conductive layer in the conventional structure.

The present invention also supplies an amorphous silicon layer to become an active layer with Joule's heat intensively by locating an electrically-resistant area on the nearby amorphous silicon layer to become the active layer. Therefore, the active layer is crystallized only by supplying less power than is needed to heat up the whole substrate.

Moreover, the crystallizing time is shortened remarkably as the portion of amorphous silicon to become an active layer is crystallized by supplying Joule's heat of a heat generating conductive layer intensively.

Besides, there is no damage on the substrate because the Joule's heat is applied to the local area of the substrate.

It will be apparent to those skilled in the art that various modifications and variations can be made to a method of crystallizing a silicon film and a method of manufacturing a liquid crystal display apparatus of the present invention without departing from the spirit or scope of the inventions. Thus, it is intended that the present invention cover all various modifications and variations of this invention within the scope of the appended claims and equivalents thereof.

What is claimed is:

1. A method of crystallizing an amorphous silicon film comprising the steps of:
   providing a substrate;
   forming an amorphous silicon film and a heat generating conductive layer on a substrate on the substrate; and
   increasing a temperature of the amorphous silicon film by applying a predetermined voltage to the heat generating conductive layer wherein heat is generated by the heat generating conductive layer so as to heat the amorphous silicon film.

2. The method of crystallizing an amorphous silicon film according to claim 1, wherein the heat generating conductive layer is formed of at least one of a metal, a transparent conductive substance, doped amorphous silicon or plasma-treated amorphous silicon.

3. A method of crystallizing an amorphous silicon film comprising the steps of:
   providing an insulating substrate;
   forming a heat generating conductive layer on the insulating substrate;
   forming an insulating layer on the heat generating conductive layer;
   forming an amorphous silicon film on the insulating layer; and
   applying a predetermined voltage to the heat generating conductive layer wherein electric current is transmitted through the heat generating conductive layer to heat the amorphous silicon film.

4. The method of crystallizing an amorphous silicon film according to claim 3, wherein the heat generating conductive layer is a gate line formed on the insulating substrate.

5. A method manufacturing a liquid crystal display comprising the step of:
   providing a substrate;
   forming an active layer of amorphous silicon on the substrate;
   forming a first insulating layer on the substrate including the active layer;
   forming a gate pattern on the first insulating layer wherein the gate pattern includes a gate line having a gate electrode, a connecting bar connecting the gate line to other gate lines, a connecting bar pad, a test electrode, and a test electrode pad;
   doping the active layer with impurities while using the gate electrode as a mask;
   forming a second insulating layer over the substrate;
   exposing portions of the active layer doped with the impurities, the connecting bar pad, the connecting bar, and the test electrode pad by etching the second insulating layer to form an intermediate structure of layers;
   crystallizing the amorphous silicon constituting the active layer by heating the active layer via a voltage applied between the connecting bar pad and the test electrode pad;
   forming a conductive layer on the intermediate structure;
   forming a photoresist pattern covering portions of the conductive layer over the source, the drain, and the test electrode pad on the conductive layer;
   forming source and drain electrodes and a first test cover layer by etching the conductive layer while using the photoresist pattern as a mask; and
   removing the connecting bar.

6. The method according to claim 5, wherein the connecting bar is formed of a substance which can be removed by an etchant that can also remove the conductive layer.

7. The method according to claim 5, the method further comprising the steps of:
   forming a third insulating layer over the substrate;
   exposing the drain electrode and the first test cover layer by etching the third insulating layer; and
   forming a pixel electrode connected to the drain electrode and a second test cover layer covering the first test cover layer on the third insulating layer.

8. A method of manufacturing a liquid crystal display comprising the steps of:

providing an insulating substrate;

forming a plurality of gate lines, a connecting bar connecting first ends of the gate lines to one another, and a test electrode bar connecting second ends of the gate lines to one another on the insulating substrate;

forming a first insulating layer covering the gate lines, the connecting bar, and the test electrode bar;

depositing an amorphous silicon film and a doped amorphous silicon film successively on the first insulating layer;

forming an ohmic contact layer by etching the doped amorphous silicon film by photolithography;

forming an active layer by etching the amorphous silicon film by photolithography;

exposing the connecting bar and the test electrode pad by etching the first insulating layer;

crystallizing the amorphous silicon constituting the active layer and the ohmic contact layer by increasing a temperature of the active and ohmic contact layers by applying a voltage between the connecting bar and the test electrode wherein electric current is transmitted through the gate lines;

depositing a conductive layer over the substrate;

forming a photoresist pattern covering the conductive layer over the source and drain and the test electrode pad;

forming source and drain electrodes and a first test cover layer by etching the conductive layer while using the photoresist pattern as a mask;

etching the ohmic contact layer while using the source and drain electrodes as a mask; and removing the connecting bar.

9. The method according to claim 8, the method further comprising the steps of:

depositing a second insulating layer covering the substrate including the source and drain electrodes and the first test cover layer;

exposing portions of the drain electrode and the first test cover layer by etching the second insulating layer; and forming a pixel electrode connected to the drain electrode and a second test cover layer covering the first test cover layer on the second insulating layer.

10. The method according to claim 8, wherein the connecting bar is formed of a substance which can be removed by an etchant that can also remove the conductive layer.

11. A method of manufacturing a liquid crystal display comprising the steps of:

providing an insulating substrate;

forming a plurality of gate lines, a connecting bar connecting first ends of the gate lines to one another, and a test electrode bar connecting second ends of the gate lines to one another on the insulating substrate;

forming a first insulating layer covering the gate lines, the connecting bar, and the test electrode bar;

depositing an amorphous silicon film on the first insulating layer;

forming an active layer by etching the amorphous silicon film by photolithography forming a source region and a drain region by doping the active layer with impurities selectively;

exposing the connecting bar and the test electrode pad by etching the first insulating layer;

crystallizing the amorphous silicon constituting the active layer by increasing a temperature of the active layer by applying a voltage between the connecting bar and the test electrode wherein electric current is transmitted through the gate lines;

depositing a conductive layer over the substrate;

forming a photoresist pattern covering the conductive layer over the source and drain and the test electrode pad;

forming source and drain electrodes and a first test cover layer by etching the conductive layer while using the photoresist pattern as a mask; and removing the connecting bar.

12. The method according to claim 11, the method further comprising the steps of:

depositing a second insulating layer covering the substrate including the source and drain electrodes and the first test cover layer;

exposing portions of the drain electrode and the first test cover layer by etching the second insulating layer; and forming a pixel electrode connected to the drain electrode and a second test cover layer covering the first test cover layer on the second insulating layer.

13. The method according to claim 11, wherein the connecting bar is formed of a substance which can be removed by an etchant that can also remove the conductive layer.

14. A method of crystallizing a silicon film, comprising the steps of:

providing a substrate;

depositing an amorphous silicon layer on the substrate wherein a plurality of first and second regions are defined in the amorphous silicon layer;

forming a heat generating conductive layer including a plurality of first and second resistors wherein the first resistors having a first resistance are located in the first regions and the second resistors having a second resistance are located in the second regions and wherein the first and second resistors define a single unitary body; and generating Joule heat by applying voltage to the heat generating conductive layer wherein the amorphous silicon layer is crystallized by the Joule heat.

15. The method of crystallizing a silicon film according to claim 14, wherein the second regions are silicon portions arranged to define an active layer of a thin film transistor.

16. The method of crystallizing a silicon film according to claim 14, wherein the second resistors are connected to the first resistors in series.

17. The method of crystallizing a silicon film according to claim 14, wherein the second resistors are connected to the first resistors in parallel.

18. The method of crystallizing a silicon film according to claim 17, wherein the electrically-conductive substance is made of one of a high resistance metal and a transparent conductive substance.

19. The method of crystallizing a silicon film according to claim 14, wherein resistances of the first and second resistors of the heat generating conductive layer are differentiated respectively by the passage length through which charge carriers pass.

20. The method of crystallizing a silicon film according to claim 14, wherein resistances of the first and second resistors of the heat generating conductive layer are differentiated respectively by the passage area through which charge carriers pass.

21. The method of crystallizing a silicon film according to claim 14, wherein the heat generating conductive layer is formed by depositing a heat generating conductive substance layer to have a first thickness on the amorphous silicon layer and by etching selectively portions of the heat generating conductive substance layer defined by the second resistors to have a second thickness which is thinner than the first thickness.

22. The method of crystallizing a silicon film according to claim 14, wherein the heat generating conductive layer is formed by depositing a first heat generating conductive substance layer on the amorphous silicon layer and by depositing a second heat generating conductive substance layer selectively on the portions corresponding to the second resistors.

23. A method of crystallizing a silicon film, comprising the steps of:

preparing a substrate having an amorphous silicon layer including a plurality of first and second regions on the substrate, a plurality of first resistors having a first resistance located in the first regions and a plurality of second resistors having a second resistance larger than the first resistance located in the second regions near the amorphous silicon layer, the first and second resistors defining a single unitary body; and generating Joule heat by applying voltage to the heat generating conductive layer wherein the amorphous silicon layer is crystallized by the Joule heat.

* * * * *